United States Patent
Song

(10) Patent No.: US 7,813,563 B2
(45) Date of Patent: Oct. 12, 2010

(54) SYSTEMS, METHODS, AND COMPUTER PROGRAM PRODUCTS FOR COMPRESSION, DIGITAL WATERMARKING, AND OTHER DIGITAL SIGNAL PROCESSING FOR AUDIO AND/OR VIDEO APPLICATIONS

(75) Inventor: Kai-Sheng Song, Tallahassee, FL (US)

(73) Assignee: Florida State University Research Foundation, Tallahassee, FL (US)

( * ) Notice: Subject to any disclaimer, the term of this patent is extended or adjusted under 35 U.S.C. 154(b) by 887 days.

(21) Appl. No.: 11/609,298

(22) Filed: Dec. 11, 2006

(65) Prior Publication Data

US 2007/0165956 A1    Jul. 19, 2007

Related U.S. Application Data

(60) Provisional application No. 60/748,967, filed on Dec. 9, 2005.

(51) Int. Cl.
G06K 9/36    (2006.01)
G06K 9/46    (2006.01)

(52) U.S. Cl. ..................................... 382/232
(58) Field of Classification Search .................. 382/232
See application file for complete search history.

(56) References Cited

U.S. PATENT DOCUMENTS

| | | | |
|---|---|---|---|
| 6,511,426 B1 | 1/2003 | Hossack et al. | |
| 6,681,204 B2 | 1/2004 | Matsumoto et al. | |
| 7,006,568 B1* | 2/2006 | Gu et al. ................ | 375/240.11 |
| 7,630,435 B2 | 12/2009 | Chen et al. | |
| 2002/0013703 A1 | 1/2002 | Matsumoto et al. | |
| 2003/0223616 A1* | 12/2003 | D'Amato et al. ............ | 382/100 |
| 2004/0022444 A1* | 2/2004 | Rhoads ........................ | 382/232 |
| 2006/0056653 A1* | 3/2006 | Kunisa ........................ | 382/100 |
| 2006/0132357 A1 | 6/2006 | Pozgay et al. | |

(Continued)

OTHER PUBLICATIONS

Birney, K.A.; Fischer, T.R., "On the modeling of DCT and subband image data for compression," Image Processing, IEEE Transactions on , vol. 4, No. 2, pp. 186-193, Feb. 1995 URL: http://ieeexplore.ieee.org/stamp/stamp.jsp?arnumber=342184&isnumber=8003.*

(Continued)

Primary Examiner—Charles Kim
Assistant Examiner—Nirav G Patel
(74) Attorney, Agent, or Firm—Sutherland Asbill & Brennan LLP

(57) ABSTRACT

Systems, methods, and computer program products are provided for digital signal processing, which may include obtaining a first set of digitized coefficients from source data and determining a best-fit distribution of a generalized Gaussian distribution for the set of digitized coefficients. The digital signal processing may further include applying a quantization algorithm to the first set of plurality of digitized coefficients to obtain a second set of quantizers, wherein the quantization algorithm is based at least in part on the determined best-fit distribution, and providing second set of quantizers as a compressed representation of the source data. The digital signal processing may also include retrieving suspected encoded data, determining at least one parameter of a generalized Gaussian distribution for the suspected encoded data, determining a digital watermark within the suspected encoded data based at least in part on the determined parameter, and extracting the digital watermark from the suspected encoded data.

13 Claims, 9 Drawing Sheets

U.S. PATENT DOCUMENTS

2007/0083114 A1  4/2007 Yang et al.

OTHER PUBLICATIONS

Chang, J., "Image Probability Distribution Based on Generalized Gamma Function," IEEE Signal Processing Letters, Apr. 2005, pp. 325-328, vol. 12, No. 4.*
Do, M.N.; Vetterli, M.; , "Wavelet-based texture retrieval using generalized Gaussian density and Kullback-Leibler distance," Image Processing, IEEE Transactions on , vol. 11, No. 2, pp. 146-158, Feb. 2002 doi: 10.1109/83.982822 URL: http://ieeexplore.ieee.org/stamp/stamp.jsp?tp=&arnumber=982822&isnumber=21173.*
Sola et al., "Ultrasound image coding using shape-adaptive DCT and adaptive quantization," Prov. SPIE, vol. 3031, 328 (1997); doi: 10.1117/12.273911, pp. 328-338.
Non-Final Office Action for U.S. Appl. No. 11/677,566 mailed Mar. 12, 2010.
Eldon Hansen, "A Globally Convergent Interval Method for Computing and Bounding Real Roots." vol. 18, No. 4/Dec. 1978, Springer Netherlands, pp. 415-424.
Notice of Allowance mailed Jun. 21, 2010 for U.S. Appl. No. 11/677,566.
P.K. Andersen, "Cox's Regression Model for Counting Processes: A Large Sample Study",The Annals of Statistics, Dec. 1982, pp. 1100-1120, vol. 10, Institute of Mathematical Statistics.
M. Antonini, "Image Coding Using Wavelet Transform", IEEE Transactions on Image Processing, Apr. 1992, pp. 205-220, vol. 1, No. 2.
S. Batalama, "On the Generalized Cramer-Rao Bound for the Estimation of the Location", IEEE Transactions on Signal Processing, Feb. 1997, vol. 45, No. 2.
J. Chang, "Image Probability Distribution Based on Generalized Gamma Function", IEEE Signal Processing Letters, Apr. 2005, pp. 325-328, vol. 12, No. 4.
F. Chen, "Lattice Vector Quantization of Generalized Gaussian Sources", IEEE Transactions on Information Theory, Jan. 1997, pp. 92-103, vol. 43, No. 1.
M. Do, "Wavelet-Based Texture Retrieval Using Generalized Gaussian Density and Kullback-Leibler Distance", IEEE Transactions on Image Processing, Feb. 2002, pp. 146-158, vol. 11, No. 2.
N. Farvardin, "Optimum Quantizer Performance for a Class of Non-Gaussian Memoryless Sources", IEEE Transactions on Information Theory, May 1984, pp. 485-497, vol. IT-30, No. 3.
H. Hager, "Inferential Procedures for the Generalized Gamma Distribution", Journal of the American Statistical Association, Dec. 1970, pp. 1601-1609, vol. 65, No. 332.
P. Huang, "On New Moment Estimation of Parameters of the Generalized Gamma Distribution Using It's Characterization", Taiwanese Journal of Mathematics, pp. 1083-1093, vol. 10, No. 4, Jun. 2006.
R. Joshi, "Comparison of Generalized Gaussian and Laplacian Modeling in DCT Image Coding", IEEE Signal Processing Letters, May 1995, pp. 81-82, vol. 2, No. 5.
R. Joshi, "Image Subband Coding Using Arithmetic Coded Trellis Coded Quantization", IEEE Transactions on Circuits and Systems for Video Technology, Dec. 1995, pp. 515-523, vol. 5, No. 6.
E. Lam, "A Mathematical Analysis of the DCT Coefficient Distributions for Images", IEEE Transactions on Image Processing, Oct. 2000, pp. 1661-1666, vol. 9, No. 10.
J. Lawless, "Inference in the Generalized Gamma and Log Gamma Distributions", Technometrics, Aug. 1980, pp. 409-418, vol. 22, No. 3, American Statistical Association.
P. Loyer, "Lattice-Codebook Enumeration for Generalized Gaussian Source", IEEE Transactions on Information Theory, Feb. 2003, pp. 521-528, vol. 49, No. 2.
S. Mallat, "A Theory for Multiresolution Signal Decomposition: The Wavelet Representation", IEEE Transactions on Pattern Analysis and Machine Intelligence, Jul. 1989, pp. 674-693, vol. 11, No. 7.
F. Muller, "Distribution Shape of Two-dimensional DCT Coefficient of Natural Images", Electronic Letters, Oct. 28, 1993, pp. 1935-1936, vol. 29, No. 22.
V.B. Parr, "A Method for Discriminating Between Failure Density Functions Used in Reliability Predictions", Technometrics, Feb. 1965, pp. 1-10, vol. 7, No. 1, American Statistical Association.
R.L. Prentice, "A Log Gamma Model and Its Maximum Likelihood Estimation", Biometrika, Dec. 1974, pp. 539-544, vol. 61, No. 3, Biometrika Trust.
R. Reininger, "Distributions of the Two-Dimensional DCT Coefficients for Images", IEEE Transactions on Communications, Jun. 1983, pp. 835-839, vol. COM-31, No. 6, IEEE Communications Society.
K. Sharifi, "Estimation of Shape Parameter for Generalized Gaussian Distribution in Subband Decompositions of Video", IEEE Transactions on Circuits and Systems for Video Technology, Feb. 1995, vol. 5, No. 1.
J. Shin, "Statistical Modeling of Speech Signals Based on Generalized Gamma Distribution", IEEE Signal Processing Letters, Mar. 2005, pp. 258-261, vol. 12, No. 3.
E.W. Stacy, "A Generalization of the Gamma Distribution", The Annals of Mathematical Statistics, Sep. 1962, pp. 1187-1192, vol. 33, No. 3, Institute of Mathematical Statistics.
E.W. Stacy, "Parameter Estimation for a Generalized Gamma Distribution", Technometrics, Aug. 1965, pp. 349-358, vol. 7, No. 3, American Statistical Association.
E.W. Stacy, "Quasimaximum Likelihood Estimators for Two-parameter Gamma Distributions", QML Estimators, Mar. 1973, pp. 115-124, IBM J. Res. Develop.
N. Tanabe, "Subband Image Coding Using Entropy-Coded Quantization Over Noisy Channels", IEEE Journal on Selected Areas in Communications, Jun. 1992, pp. 926-943, vol. 10, No. 5.
M. Varanasi, "Parametric Generalized Gaussian Density Estimation", Journal Acoustical Society of America, Oct. 1989, pp. 1404-1415, vol. 86 (4), Acoustical Society of America.
D. Wingo, "Computing Maximum-Likelihood Parameter Estimates of the Generalized Gamma Distribution by Numerical Root Isolation", IEEE Transactions on Reliability, Dec. 1987, pp. 586-590, vol. R-36, No. 5.
G. Van De Wouwer, "Statistical Texture Characterization from Discreet Wavelet Representation", IEEE Transactions on Image Processing, Apr. 1999, pp. 592-598, vol. 8, No. 4.
K. Birney, "On the Modeling of DCT and Subband Image Data for Compression", IEEE Transactions on Image Processing, Feb. 1995, pp. 186-193, vol. 4, No. 2.

* cited by examiner

US 7,813,563 B2

SYSTEMS, METHODS, AND COMPUTER PROGRAM PRODUCTS FOR COMPRESSION, DIGITAL WATERMARKING, AND OTHER DIGITAL SIGNAL PROCESSING FOR AUDIO AND/OR VIDEO APPLICATIONS

RELATED APPLICATIONS

The present invention claims benefit of U.S. Provisional Application Ser. No. 60/748,967, filed Dec. 9, 2005, and entitled "Systems, Methods, and Computer Program Products for Determining Parameters of a Generalized Gaussian Distribution," which is hereby incorporated by reference in its entirety as if fully set forth herein.

FIELD OF THE INVENTION

Aspects of an embodiment of the invention relate generally to digital signal processing, and more particularly to compression, digital watermarking, and other digital signal processing for audio and/or video applications.

BACKGROUND OF THE INVENTION

The continued growth of Internet has resulted in the increasing use of digital media, which includes audio, video, and a combination thereof. However, limited bandwidth and transmission speeds over the Internet still make the real-time transmission of digital media difficult since the source feed may be of high resolution, of a large size, and/or of an essentially random nature, thereby making the source feed difficult to compress instantaneously for real-time transmission.

Accordingly, there is a need in the industry for systems, methods, and computer program products that facilitate in the compression and transmission of digital media. Additionally, there is a need in the industry for reliability encoding and decoding invisible digital watermarks within the digital media for determining unauthorized distribution of such digital media.

SUMMARY OF THE INVENTION

According to an embodiment of the present invention, there is a computer-implemented method for performing digital signal processing. The computer-implemented method includes obtaining a first set of digitized coefficients from source data and determining a best-fit distribution of a generalized Gaussian distribution for the set of digitized coefficients. The computer-implemented method further includes applying a quantization algorithm to the first set of plurality of digitized coefficients to obtain a second set of quantizers, where the quantization algorithm is based at least in part on the determined best-fit distribution, and providing second set of quantizers as a compressed representation of the source data.

According to another embodiment of the present invention, there is a system for performing digital signal processing. The system includes a memory for storing executable instructions and a processor in communication with the memory. The processor is operable to execute the stored instructions to obtain a first set of digitized coefficients from source data and determine a best-fit distribution of a generalized Gaussian distribution for the set of digitized coefficients. The processor is further operable to apply a quantization algorithm to the first set of plurality of digitized coefficients to obtain a second set of quantizers, where the quantization algorithm is based at least in part on the determined best-fit distribution, and provide second set of quantizers as a compressed representation of the source data.

According to still another embodiment of the present invention, there is a computer-implemented method for performing digital signal processing. The computer-implemented method includes retrieving suspected encoded data and determining at least one parameter of a generalized Gaussian distribution for the suspected encoded data. The computer-implemented method includes determining a digital watermark within the suspected encoded data based at least in part on at least one the determined parameter and extracting the digital watermark from the suspected encoded data.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

Figure 1:
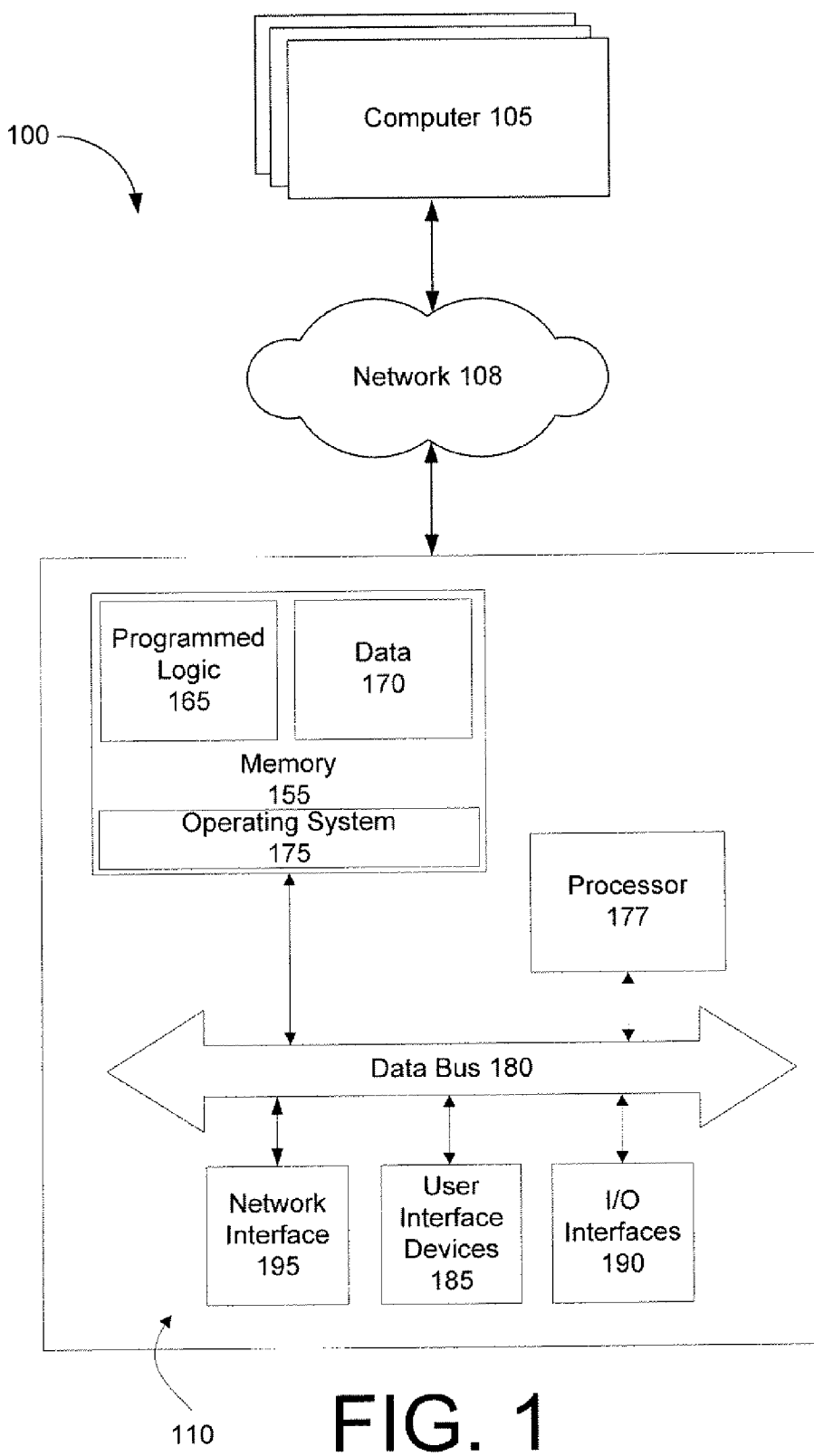
FIG. 1 is an overview of a digital signal processing system, according to an embodiment of the present invention.

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The present invention is described below with reference to block diagrams of systems, methods, apparatuses and computer program products according to an embodiment of the invention. It will be understood that each block of the block diagrams, and combinations of blocks in the block diagrams, respectively, can be implemented by computer program instructions. These computer program instructions may be loaded onto a general purpose computer, special purpose computer, or other programmable data processing apparatus to produce a machine, such that the combination of computing hardware and instructions which execute thereon constitute means for implementing the functionality of each block of the block diagrams, or combinations of blocks in the block diagrams discussed in detail in the descriptions below.

These computer program instructions may also be stored in a computer-readable memory to constitute an article of manufacture. The article of manufacture may be used in conjunction with a computing device to cause the instructions from the article of manufacture to be loaded onto and executed by the computing device, and thereby implement the function specified in the block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the block or blocks.

Accordingly, blocks of the block diagrams support combinations of means for performing the specified functions, combinations of steps for performing the specified functions and program instruction means for performing the specified functions. It will also be understood that each block of the block diagrams, and combinations of blocks in the block diagrams, can be implemented by general or special purpose hardware-based computer systems that perform the specified functions or steps, or combinations of general or special purpose hardware and computer instructions.

The inventions may be implemented through one or more application programs running on one or more operating systems of one or more computers. The inventions also may be practiced with diverse computer system configurations, including hand-held devices, multiprocessor systems, microprocessor based or programmable consumer electronics, mini-computers, mainframe computers, and the like.

Application programs that are components of the invention may include modules, objects, data structures, etc., that perform certain tasks or implement certain abstract data types. A particular application program (in whole or in part) may reside in a single or multiple memories. Likewise, a particular application program (in whole or in part) may execute on a single or multiple computers or computer processors. Exemplary embodiments of the present invention will hereinafter be described with reference to the figures, in which like numerals indicate like elements throughout the several drawings.

Embodiments of the present invention may provide for systems, methods, and computer program products that may provide signal processing and/or digital watermarking for audio and video applications, including the distribution (e.g., real-time distribution) of audio and video over the Internet and other mediums (e.g., DVD, CDs, flash drives, etc.). Indeed, as will be discussed in further detail below, embodiments of the present invention may provide exemplary compression methodologies for digital media transmission and/or distribution. Further embodiments of the present invention, may provide for highly reliable digital watermarking retrieval and verification methodologies for such digital media.

I. System Overview

FIG. 1 is an illustrative system overview of a signal processing system 100 in accordance with an embodiment of the present invention. As shown in FIG. 1, the signal processing system 100 may include one or more computers 105 in communication with a control unit 110 via one or more networks 108. The network 108 may include a variety of wired and wireless networks, both private and public, including the Internet, a local area network, a metro area network, a wide area network, a public switched telephone network, or any combination thereof.

Each computer 105 may include client software (e.g., applet, stand-alone software, a web client, Internet portal) to interface with the control unit 110. The control unit 110 may provide data to and/or receive data from the computer 105. According to an embodiment of the present invention, the control unit 110 may compress source data and distribute the compressed data to one or more computers 105. Likewise, the control unit 110 may also be operative to embed digital watermarks within the data to the distributed (e.g., images, audio, etc.) and/or retrieve and verify digital watermarks from such data, according to embodiments of the present invention.

Still referring to FIG. 1, the control unit 110 may include a memory 155 that stores programmed logic 165 (e.g., software) in accordance with an embodiment of the present invention. The programmed logic 165 may include one or more modules for executing compression, digital watermarking, and other signal processing methodologies, or combinations thereof, in accordance with embodiments of the present invention. The memory 155 may include data 170 that may be utilized in the operation of the present invention and an operating system 175. The data 170 may include source data for distribution as well as received data for verification and extraction of a digital watermark. The data 170 may further include parameters associated with one or more of the compression, digital watermarking, and other signal processing methods described herein. A processor 177 may utilize the operating system 175 to execute the programmed logic 165, and in doing so, may also utilize (e.g., store, modify, and/or retrieve) the data 170.

A data bus 180 may provide communication between the memory 155 and the processor 177. Users may interface with the control unit 110 via a user interface device(s) 185 such as a keyboard, mouse, control panel, display, microphone, speaker, or any other devices capable of communicating information to or from the control unit 110. The control unit 110 may be in communication with other external devices via I/O Interface(s) 190. Additionally, the control unit 110 may include a network interface 195 for communication with the network 100, including one or more computers 105. Further the control unit 110 and the programmed logic 165 implemented thereby may comprise software, hardware, firmware or any combination thereof. The control unit 110 may be a personal computer, mainframe computer, minicomputer, any other computer device, or any combination thereof without departing from embodiments of the present invention.

II. Operational Compression Methodology

Figure 2:
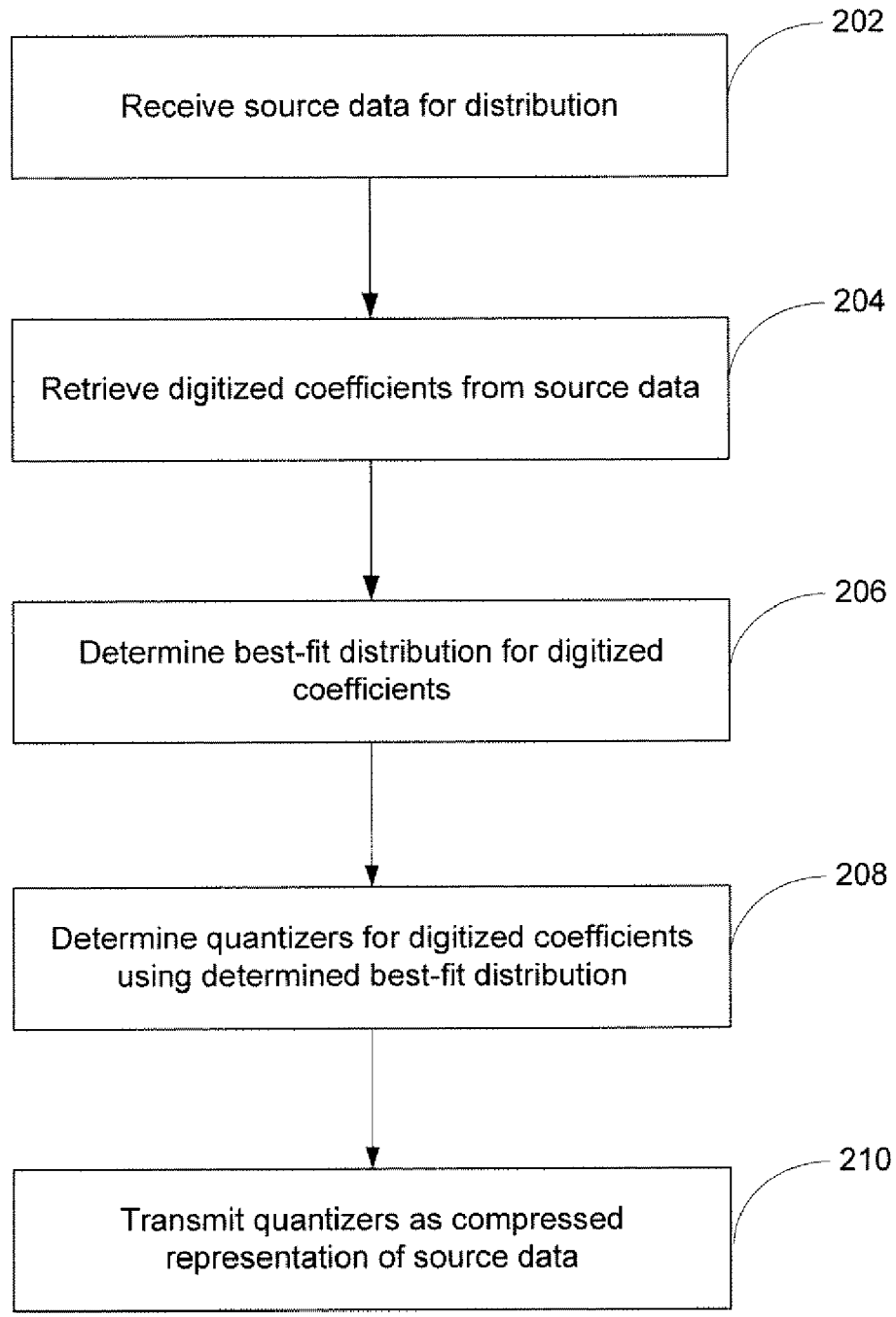
FIG. 2 illustrates an exemplary flow diagram for the compression of source data, according to an exemplary embodiment of the present invention.
Figure 3:
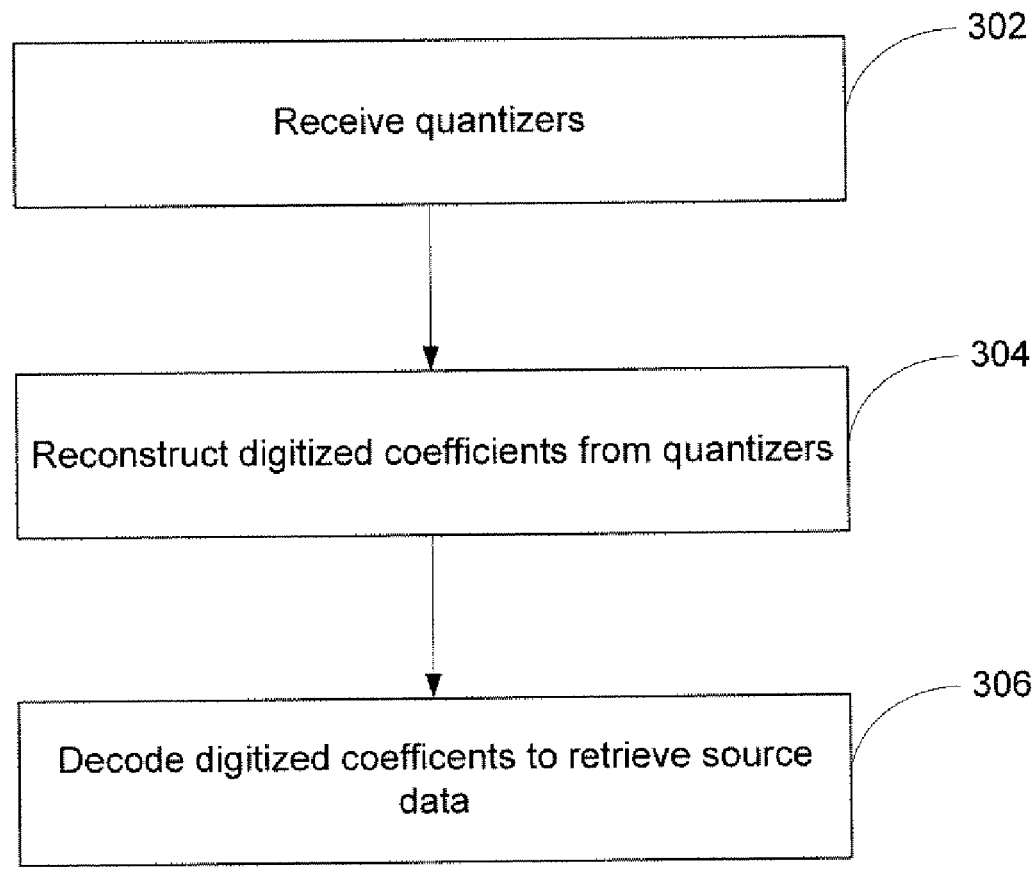
FIG. 3 illustrates an exemplary flow diagram for the decompression of source data, according to an exemplary embodiment of the present invention.

The operation of the signal processing system 100 of FIG. 1 will now be discussed in further detail with respect to FIGS. 2 and 3. FIG. 2 illustrates an exemplary flow diagram for compression of the source data while FIG. 3 illustrates an exemplary flow diagram for the decompression of the source data, according to an embodiment of the present invention. As block 202 of FIG. 2, a control unit 110 may receive source data for distribution. According to an exemplary embodiment of the present invention, this source data may be in analog form and include audio, video, and a combination thereof, and the like. This source data may also be essentially real-time source data. In block 202, the control unit 110 and in particular, the component programmed logic 165, may execute instructions for retrieving digitized coefficients (e.g., transform coefficients) from the source data. These digitized coefficients (e.g., transform coefficients) may utilize frequency transformation coefficients, including discrete cosine transform (DCT) coefficients, according to an embodiment of the present invention. For example, with DCT coefficients, the source data may be transformed from the time domain to the frequency domain. Other transform coefficients may include Fast Fourier transform (FFT) coefficients, Wavelet Transform (WT) coefficients, or Laplace transform coefficients. However, one of ordinary skill in the art will readily recognize that these digitized coefficients may be obtained via methods other than transforms. For example, the digitized coefficients may be obtained from direct measurements in a spatial or time domain such as raw image pixel intensity values or sound intensity values.

The digitized coefficients, which are typically represented by sequences of real numbers, retrieved from the source data of block 204 may essentially form a random distribution. In block 206, a globally convergent method in accordance with an embodiment of the present invention may determine a best-fit distribution from a generalized family of distributions. The generalized family of distributions may be a generalized Gaussian distribution, which will be described in further detail below. The best-fit distribution may be determined based upon the parameters (e.g., shape parameter, scale parameter) determined for the generalized Gaussian distribution. According to an exemplary aspect of the present invention, the parameters may determine that the best-fit distribution is a Gaussian Distribution, a Laplacian Distribution, or the like.

In block 208, the transform coefficients determined in block 204 can be compressed and/or summarized using quantizers in accordance with a quantization algorithm (e.g., Lloyd-Max, uniform scalar dead-zone quantization, generalized uniform scalar dead-zone quantization, trellis coded quantization, vector quantization, entropy constrained scalar quantization (for DWT/DCT quantization tables, etc.). As described above, transform coefficients may be a real number along a real line. Generally, such a real line may be partitioned using quantizers, where each quantizer represents a portion or range (e.g., quantization step size) of the real line. Accordingly, transform coefficients that fall within a range or portion of the real line may be assigned to the quantizer that represents the respective range or portion. Further, a dead-zone may be indicated on the real line, perhaps from $-\delta$ to $+\delta$, and a simplified quantizer (e.g., null or zero) may be provided for coefficients that fall within the dead-zone. Therefore, the source data may be compressed because each quantizer may be smaller in size than the transform coefficient that it represents. Furthermore, the source data may be compressed because the number of quantizer levels may be less than the number of digitized coefficients.

Still referring to block 208, in accordance with an embodiment of the present invention, a quantization algorithm (Lloyd-Max, uniform scalar dead-zone quantization, generalized uniform scalar dead-zone quantization, trellis coded quantization, etc.) may be based at least in part on a generalized Gaussian distribution. In such a case, embodiments of the present invention may provide an efficient and globally convergent method for determining parameters for a generalized Gaussian distribution, which may then be utilized by the quantization algorithm for determining the quantizers, the quantization step size, and/or the dead-zone. More specifically, these parameters may include shape and scale parameters for the generalized Gaussian distribution associated with the transform coefficients (previously determined in block 206). As shown in block 210, the quantizers determined in block 208 may then be transmitted to one or more of the computers 105 as a compressed representation of the source signal.

FIG. 3 illustrates an exemplary flow diagram for the decompression of the source data, according to an exemplary embodiment of the present invention. In block 302, the computer 105 may receive the quantizers from the control unit 110. In addition to the quantizers, the computer 105 may have also received decompression information, including information associated with the type of quantization methodology utilized and the best-fit distribution (e.g., information associated with the shape and scale parameters determined for the generalized Gaussian distribution) utilized previous in step 208. Likewise, the computer 105 may have also received information regarding the digitization methodology of step 204. In block 304, the computer 105 may reconstruct the digitized coefficients from the received quantizers. Having retrieved or reconstructed the digitized coefficients, the digitized coefficients can then be decoded to obtain the source data, or an approximation thereof (block 306). As an example, DCT coefficients may be transformed from the frequency domain back to the time domain to obtain the source data. Many variations of the compression and decompression methodology described above may be available without departing from embodiments of the present invention.

III. Operational Digital Watermarking Methodology

Figure 4:
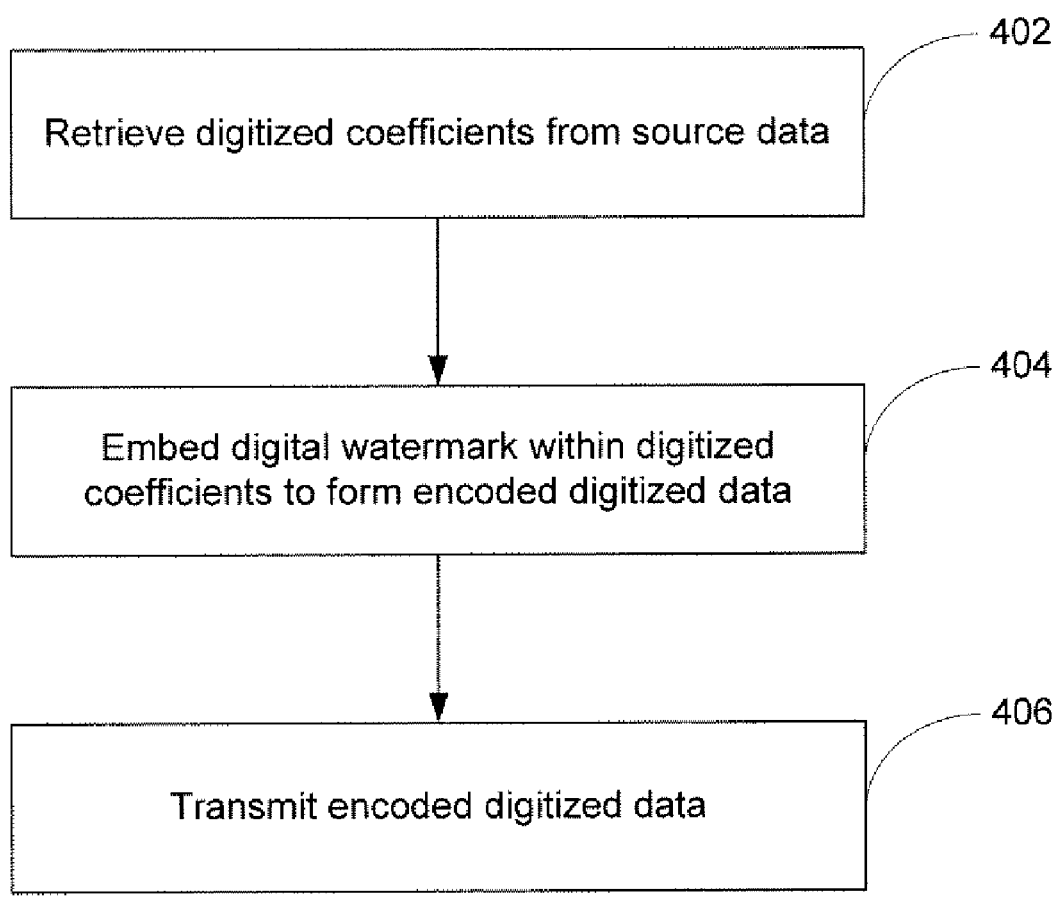
FIG. 4 illustrates an exemplary flow diagram for encoding digitized data with a digital watermark, according to an embodiment of the present invention.

In accordance with an embodiment of the present invention, digital watermarks may be added or embedded as extra bits to digitized data (e.g., digitized coefficients), such as audio, video, and a combination thereof. These extra bits ("the digital watermark") may provide information regarding the origin of the digital data (e.g., author, place, date, and other identification information). The extra bits typically do not change the digitized data to a perceptible extent, according to an embodiment of the present invention. FIG. 4 illustrates an exemplary flow diagram for encoding the digitized data with the digital watermark, according to an exemplary embodiment of the present invention.

In FIG. 4, the digitized coefficients may be retrieved from source data (block 402). As described previously, these digitized coefficients may be transform coefficients, including DCT, FFT, WT, or Laplace coefficients. Likewise, these digitized coefficients may be obtained via methods other than transforms. For example, the digitized coefficients may be obtained from direct measurements in a spatial or time domain such as raw image pixel intensity values or sound intensity values. These digitized coefficients may be obtained via methods other than transforms, including from direct measurements in a spatial or time domain such as raw image pixel intensity values or sound intensity values.

In block 404, the digital watermark (e.g., one or more groups of bits, etc.) may be embedded within the digitized coefficients to form encoded digitized coefficients. According to an embodiment of the present invention, the encoded digitized coefficients $y_i$ may be determined as $y_i = x_i *(1+\alpha * w_i)$ in accordance with an exemplary spread spectrum watermarking, where $x_i$ is the digitized coefficient (e.g., a DCT coefficient, DWT, FFT, from independent component analysis, etc.) and $w_i$ is the digital watermark information. Generally, $\alpha$ may be selected by the encoder and may be a relatively small value so that the digital watermark information $w_i$ will remain imperceptible to the user.

According to another embodiment of the present invention, other watermarking methods may be utilized, including an exemplary quantization-based watermarking method. With such a quantization-based watermarking method, the a plurality of the digitized coefficients (e.g., DCT coefficients) may be quantized as described above and rounded (e.g., perhaps to the nearest integer). The rounding method may be indicative of the quantization-based watermarking method.

For example, the quantization-based watermarking method may round a plurality of quantized values, as necessary, to an even number or an odd number (e.g., encoded with a 0 or 1).

It will be appreciated that other watermarking methods may also be utilized in accordance with alternative embodiments of the present invention, including quantization index modulation and hybrid watermarking methods. However, for these methods to be effective, it may be necessary to accurately model the distributions of the digitized coefficients (e.g., DCT, DWT, FFT, Fourier-Mellin transform, coefficients generated by independent component analysis (ICA), and the like), thereby allowing for more precise quantization tables to be used within these methods. Many other variations of the watermarking methods are available.

After the digital watermark has been embedded within the digitized coefficients (block 404), then the encoded digitized data may be transmitted or otherwise distributed. (block 406). Further, information regarding the encoding (e.g., the digitization method, the digital watermarking method, etc.) may also be transmitted or otherwise distributed. Although not explicitly illustrated as such, the encoded digitized data may be compressed prior to transmission or distribution. Such compression may be provided as described herein in accordance with an exemplary embodiment of the present invention.

Figure 5:
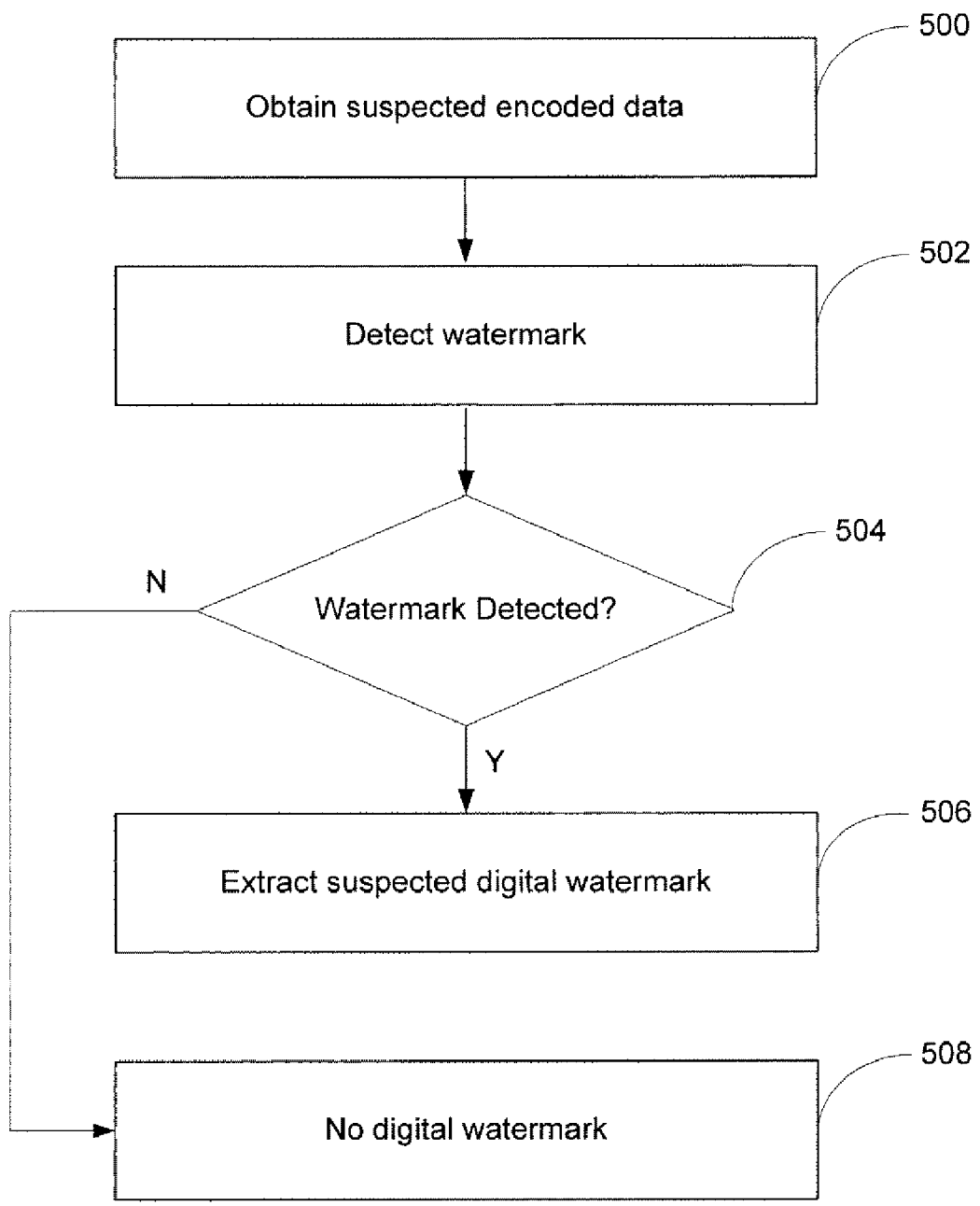
FIG. 5 illustrates an exemplary flow diagram for verifying whether a digital watermark is embedded within digitized data, according to an exemplary embodiment of the present invention.

FIG. 5 illustrates a flow diagram for verifying whether digital watermark is embedded within digitized data, according to an exemplary embodiment of the present invention. In FIG. 5, the suspected encoded data is obtained for processing (block 500). In block 502, the watermark may be detected within the suspected encoded data in accordance with an embodiment of the present invention. For example, the detection may rely upon one or more test statistics for the suspected encoded data, which may include the maximum likelihood-based test statistics or Bayesian statistics. In particular, the test statistics may be evaluated as exceeding a given threshold value based upon the parameters determined for a generalized Gaussian distribution associated with the suspected encoded data. Alternatively, the probability of the test statistic exceeding a given threshold value may be determined based upon the parameters determined for a generalized Gaussian distribution associated with the suspected encoded data. Accordingly, the evaluation or computation of the probability of the test statistic exceeding a given threshold value may be indicative of whether a watermark has been detected (block 504).

If the evaluation or computation the probability of the test statistic exceeding a given threshold is sufficiently small (e.g., thereby rejecting the null hypothesis that there is no digital watermark) (block 504), then the suspected digital watermark may be detected and extracted (block 506). Otherwise, the suspected encoded data may be determined not to include a digital watermark (block 508).

Returning back to block 506, the suspected digital watermark may be extracted. This extraction may be based upon either a non-blind extraction or a blind extraction in accordance with an embodiment of the present invention. First, with a non-blind extraction, the original encoded data and the digital watermarking method may be known. Using the original encoded signal and the suspected encoded signal (and perhaps the digital watermarking method), an extraction may be based upon a difference between the original embedded data and the suspected embedded data, according to an exemplary embodiment of the present invention. Second, according to a blind extraction, the original encoded data may not be necessary for the extraction of the digital watermark. As described above, one of the digital watermarking methods may round a plurality of quantized values to either an odd or even number. Accordingly, by examining the suspected encoded data, if a significant number of the expected plurality of coefficients in the suspected encoded data are either odd or even, then the digital watermark may be decoded using the appropriate odd or even system (e.g., using the 0 or 1 decoding).

IV. Methodology for Determining the Best-Fit Distribution of Generalized Gaussian Distribution The determination of the best-fit distribution for the transform coefficients, as introduced in block 206 of FIG. 2, will now be discussed in further detail below. Generally, the methodology may provide a globally-convergent method for determining the parameters of a generalized Gaussian distribution family, according to an embodiment of the present invention. These parameters of the generalized Gaussian distribution may be indicative of the type of best-fit distribution from the generalized Gaussian distribution family. For example, the parameters may indicate a Gaussian or Laplace distribution.

In accordance with an embodiment of the present invention, the two-parameters (shape parameter θ and scale parameter σ) of the generalized Gaussian distribution may be utilized in digital signal processing (e.g., steps 206, 208 of FIG. 2). In particular, the generalized Gaussian distribution (GGD) has a probability density function that may be specified by:

$$f(x, \sigma, \theta) = \frac{\theta}{2\sigma\Gamma(1/\theta)} e^{-\left|\frac{x}{\sigma}\right|^\theta}, \quad (1)$$

where θ represents the shape parameter and σ represents the scale parameter (collectively referred to as parameters of the GGD).

In accordance with an embodiment of the present invention, the shape parameter θ (and thus the scale parameter σ) of the generalized Gaussian distribution may be estimated with very high accuracy using a computationally-efficient and globally-convergent methodology. More specifically, an estimated shape parameter is provided by the root of the following shape parameter estimation equation:

$$Z_n(\theta) = \frac{\frac{1}{n}\sum_{i=1}^{n}|X_i|^{2\theta}}{\left(\frac{1}{n}\sum_{i=1}^{n}|X_i|^{\theta}\right)^2} - (\theta+1) = 0,$$

where $X_1 \ldots X_n$ represent the digitized coefficients.

Given any starting value of the shape parameter θ, the Newton-Raphson root-finding iteration method, as well known in the art, may be applied to the estimated shape equation $Z_n(\theta)=0$ to find the actual value of the shape parameter θ. The Newton-Raphson root-finding iteration method for the above estimated shape equation $Z_n(\theta)=0$ will always converge to a unique global root representing the actual shape parameter θ.

According to an another embodiment of the present invention, a transformation, which may be a logarithmic transformation, of the estimated shape equation $Z_n(\theta)=0$ may be utilized determine the actual value of the shape parameter θ. If a logarithmic transformation $$\left(\text{e.g., } \log\left(\frac{1}{n}\sum_{i=1}^{n}|X_i|^{2\theta}\right) - \log\left(\left(\frac{1}{n}\sum_{i=1}^{n}|X_j|^{\theta}\right)^2\right) - \log(\theta+1)\right)$$

is utilized, then the algorithm may converge to a unique global root in fewer iterations. Further, Halley's method may be utilized for $Z_n(\theta)=0$ or the logarithmic transformation of $Z_n(\theta)=0$, which may always converge to a unique global root representing the actual shape parameter θ. In accordance with an embodiment of the present invention, the use of Halley's method may provide global convergence to a unique global root (e.g., actual shape parameter θ) in significantly fewer (e.g., approximately half as many) iterations. It will be appreciated that other transformations and root-solving methods may be utilized for the estimated shape equation $Z_n(\theta)=0$ without departing from embodiments of the present invention.

Moreover, it will be appreciated that other parameterizations of the GGD, including those associated with JPEG compression (e.g., JPEG-2000), may be available without departing from embodiments of the present invention. For example, according to an alternative embodiment, the GGD probability function p(x) may be specified instead by:

$$p(x) = \frac{\alpha}{2\sigma\Gamma(1/\alpha)}\sqrt{\frac{\Gamma(3/\alpha)}{\Gamma(1/\alpha)}}\exp\left(-\left(\sqrt{\frac{\Gamma(3/\alpha)}{\Gamma(1/\alpha)}}\left(\frac{|x|}{\sigma}\right)\right)^{\alpha}\right),$$

where α is similar to the shape parameter θ described above and $$\sigma\left(\sqrt{\frac{\Gamma(1/\alpha)}{\Gamma(3/\alpha)}}\right)^{1/\alpha}$$

is similar to the scale parameter σ described above. Other parameterizations of the GGD are available without departing from embodiments of the present invention, The following discussion illustrates the global convergence of the shape estimator equation when applied to the generalized Gaussian distribution family.

A. Shape Parameter Estimator Estimation Equation

To motivate this method, we denote the true value of the parameter vector (σ, θ) by ($\sigma_0$, $\theta_0$), and suppose the random variable X is distributed according to the GGD with the parameter vector ($\sigma_0$, $\theta_0$). Here, expectations and variances computed with respect to the true distribution are denoted by $E_0$ and $Var_0$ respectively. Any probability statement made with respect to this distribution is denoted by $P_0$. Let $Y=|X/\sigma_0|^{\theta is\ 0}$. It follows from a simple calculation that Y has the gamma distribution with the PDF $g(y; \theta_0)=y^{1/\theta_0-1}e^{-y}/\Gamma(1/\theta_0)$. Hence, the first two moments of Y are given by $EY=1/\theta_0$ and $EY^2=(1+\theta_0)/\theta_0^2$. Thus $$\frac{E_0\left|\frac{X}{\sigma_0}\right|^{2\theta_0}}{\left(E_0\left|\frac{X}{\sigma_0}\right|^{\theta_0}\right)^2} = \theta_0 + 1 \qquad (2)$$

Equation (2) is trivially equivalent to the equation $$\frac{E_0|X|^{2\theta_0}}{(E_0|X|^{\theta_0})^2} = \theta_0 + 1$$

This fact leads to the consideration of the following simple function of the shape parameter θ:

$$Z(\theta) = \frac{E_0|X|^{2\theta}}{(E_0|X|^{\theta})^2} - (\theta+1) \qquad (3)$$

Figure 6:
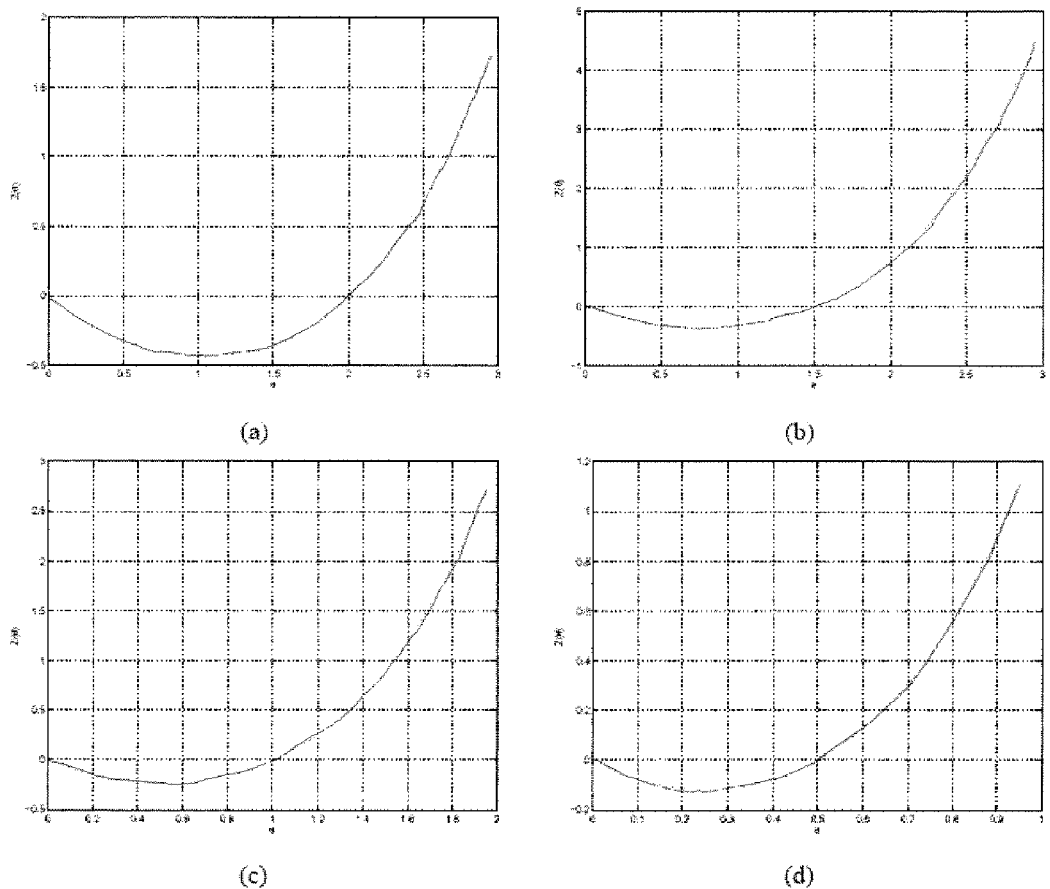
FIG. 6 illustrates exemplary plots of $Z(\theta)$ as a function of $\theta$ corresponding to four different values of the true parameter $\theta_0$, according to an exemplary embodiment of the present invention.

The idea is to consider Z as a function of the shape parameter θ and find a root of the shape equation $Z(\theta)=0$. In Section B, it will be established that the shape equation has, on the positive real line, a unique global root which is equal to the true parameter value $\theta_0$. The unique global root is illustrated in FIG. 6, which shows plots of $Z(\theta)$ as a function of θ corresponding to four different values of the true parameter $\theta_0$. Still referring to FIG. 6, in (a), $\theta_0=2$; in (b), $\theta_0=1.5$; in (c), $\theta_0=1$; and in (d) $\theta_0=0.5$.

In addition, it will be shown that the Newton-Raphson root-finding algorithm constructed by functional iteration of the shape equation converges globally to the unique root from any starting point in the semi-infinite interval $\Theta_{min}$. Since the expectation in the expression of Z is taken with respect to the true parameter value $\theta_0$, which is unknown in practice, we estimate the shape function $Z(\theta)$ by the sample estimator $Z_n(\theta)$ based on a random sample $\{X_i\}_{i=1}^n$ from the GGD($\sigma_0$, $\theta_0$), where $Z_n(\theta)$ is defined according to $$Z_n(\theta) = \frac{\frac{1}{n}\sum_{i=1}^{n}|X_i|^{2\theta}}{\left(\frac{1}{n}\sum_{i=1}^{n}|X_i|^{\theta}\right)^2} - (\theta+1) \qquad (4)$$

Figure 7:
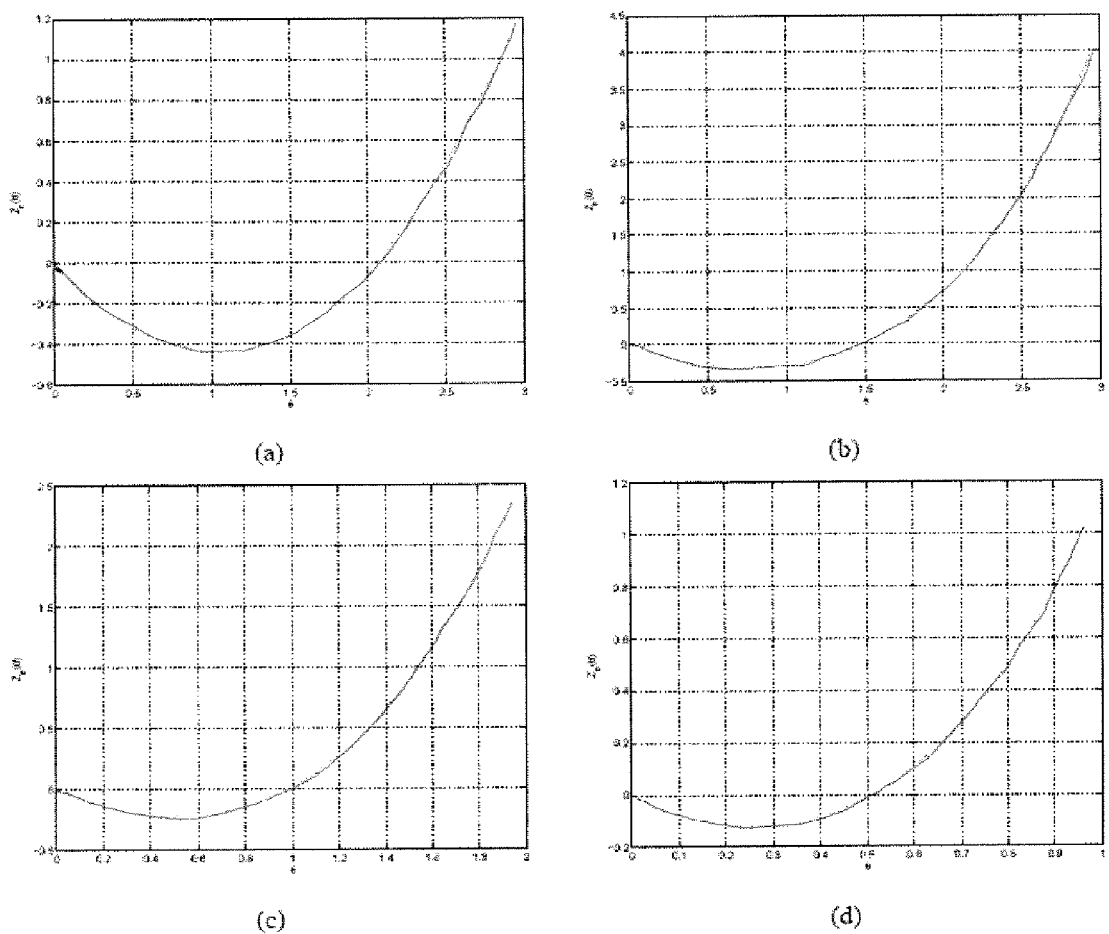
FIG. 7 illustrates exemplary plots of $Z_n(\theta)$ as a function of $\theta$ based on a random sample of size n, according to an exemplary embodiment of the present invention.

We note that it follows from the law of large numbers and the continuous mapping theorem that $Z_n(\theta)$ is a consistent estimator of $Z(\theta)$. To obtain an estimator of $\theta_0$, we solve the sample-based shape estimating equation $Z_n(\theta)=0$ for a root to be used as the estimator of $\theta_0$. For a given positive integer value of the shape parameter θ, it might be tempting, in light of equations (3) and (4), to think of the proposed estimator in the context of moment-matching (MM). However, one of the fundamental differences between our formulation and moment-matching method is that the exact order of the moments is unknown and this exponent to which the random variable is raised is precisely what we are trying to estimate. Since the true unknown exponent can be any positive real number not just integers, it may be more insightful to view our proposed estimator in the general framework of approximating the highly nonlinear yet convex transformation (3) by the convex estimating equation (4). This viewpoint is, in fact, supported by our numerical experiments showing that the MM method performs poorly for heavy-tailed distributions even for large sample sizes due to the nonrobustness of the sample moment (sample mean and variance) to extreme observations. In Section B, we show that the sample shape estimating equation $Z_n(\theta)=0$ has a unique global root with probability tending to one and the resulting root converges in probability to the true shape parameter value $\theta_0$. The unique global root of the sample-based shape estimating equation is illustrated in FIG. 7 which shows plots of the sample estimator $Z_n(\theta)$ as a function of $\theta$ based on a single random sample generated from the GGD distribution with scale parameter $\sigma_0=1$ and with the same values of $\theta_0$ as given in FIG. 6. In particular, FIG. 7 illustrates exemplary plots of $Z_n(\theta)$ as a function of $\theta$ based on a random sample of size n=500 generated from the GGD with a scale parameter $\sigma_0=1$ and the true shape parameter $\theta_0$ corresponding to four different values: (a) $\theta_0=2$, (b) $\theta_0=1.5$, (c) $\theta_0=1$, and (d) $\theta_0=0.5$.

We also prove that, with probability tending to one, the Newton-Raphson root-finding iteration converges to the unique global root of the sample shape estimating equation from any starting point on the domain $\Theta_{min}$. We conclude this section by noting that plugging the shape estimator of $\theta_0$ into the formula $$\sigma_0 = \left(\frac{\theta_0}{n}\sum_{i=1}^{n}|X_i|^{\theta_0}\right)^{\frac{1}{\theta_0}},$$

the resulting estimator is shown to be consistent for estimating $\sigma_0$.

B. Main Results

We begin this section with some notations. Let $\Theta$ denote the positive real line: $\Theta=(0,\infty)$. Let the maps Y, U, and V be defined as Y: $\theta \mapsto E_0|X|^{\theta}$ U: $\theta \mapsto E_0|X|^{\theta}\log|X|$ V: $\theta \mapsto E_0|X|^{\theta}\log^2|X|$ Similarly we define the sample analogue of these maps as follows:

$$\overline{Y}_n: \theta \mapsto \frac{1}{n}\sum_{i=1}^{n}|X_i|^{\theta}$$

$$\overline{U}_n: \theta \mapsto \frac{1}{n}\sum_{i=1}^{n}|X_i|^{\theta}\log|X_i|$$

$$\overline{V}_n: \theta \mapsto \frac{1}{n}\sum_{i=1}^{n}|X_i|^{\theta}\log^2|X_i|$$

Finally let the function $\Omega$ be defined as $$\Omega(\theta) = \frac{\Gamma\left(\frac{2\theta+1}{\theta_0}\right)\Gamma\left(\frac{1}{\theta_0}\right)}{\Gamma^2\left(\frac{\theta+1}{\theta_0}\right)} \quad (5)$$

With these notations, we can rewrite (3) as $$Z(\theta) = \frac{Y(2\theta)}{Y^2(\theta)} - (\theta+1) \quad (6)$$

$Z_n(\theta)$ in (4) can be rewritten as $$Z_n(\theta) = \frac{\overline{Y}_n(2\theta)}{\overline{Y}_n^2(\theta)} - (\theta+1) \quad (7)$$

i. Existence and Uniqueness of a Global Root

We are now ready to state the first theorem.

Theorem 1: Let $Z(\cdot)$ be defined as in (3). Then the equation $Z(\theta)=0$ for $\theta \in \Theta$ has a unique global root in $\Theta$ at the true parameter value $\theta_0$.

Proof: It follows from direct calculations that $$Y(\theta) = \frac{\sigma_0^{\theta}\Gamma\left(\frac{\theta+1}{\theta_0}\right)}{\Gamma\left(\frac{1}{\theta_0}\right)} \text{ and } Y(2\theta) = \frac{\sigma_0^{2\theta}\Gamma\left(\frac{2\theta+1}{\theta_0}\right)}{\Gamma\left(\frac{1}{\theta_0}\right)}.$$

Therefore by (5) and (6), we have $Z(\theta)=\Omega(\theta)-(\theta+1)$.

We observe that $Z(\theta_0)=0$. Hence $\theta_0$ is a root of $Z(\theta)=0$. We next demonstrate that $\theta_0$ is the only global root of $Z(\theta)=0$. To this end, we shall show that $Z(\theta)$ is a strictly convex function of $\theta$ in $\Theta$. Let $\psi_0$ and $\psi_1$ denote the digamma and trigamma functions, respectively. Let the function $\Delta$ be defined as $$\Delta(\theta) = \psi_0\left(\frac{2\theta+1}{\theta_0}\right) - \psi_0\left(\frac{\theta+1}{\theta_0}\right) \quad (8)$$

Let $\dot{\Delta}$, $\dot{\Omega}$, and $\dot{Z}$ denote their respective derivatives of $\Delta$, $\Omega$ and $Z$ with respect to $\theta$. Then some extensive computations show that $$\dot{\Omega}(\theta) = \frac{2\Omega(\theta)\Delta(\theta)}{\theta_0} \quad (9)$$

$$\dot{Z}(\theta) = \frac{2\Omega(\theta)\Delta(\theta)}{\theta_0} - 1$$

and $$\ddot{Z}(\theta) = \frac{2}{\theta_0}[\dot{\Omega}(\theta)\Delta(\theta) + \Omega(\theta)\dot{\Delta}(\theta)] \quad (10)$$

$$= \frac{2\Omega(\theta)}{\theta_0^2}[2\Delta^2(\theta) + \theta_0\dot{\Delta}(\theta)],$$

where $\ddot{Z}$ denotes the second derivative of Z with respect to $\theta$. We note that $\psi_0$ and $\psi_1$ have the following series expansions:

$$\psi_0(x) = -\gamma + \sum_{k=1}^{\infty}\frac{(x-1)}{k(k+x-1)},$$

where $\gamma$ is the Euler constant and $$\psi_1(x) = \sum_{k=1}^{\infty}\frac{1}{(k+x-1)^2}.$$

It follows from these expansions of digamma and trigamma functions that (8) can be rewritten as $$\Delta(\theta) = \frac{\theta}{\theta_0} \sum_{k=1}^{\infty} \frac{1}{a_k(\theta)a_k(2\theta)},$$

where $$a_k(\theta) = k + \frac{\theta+1}{\theta_0} - 1.$$

With $$a_k(0) = K + \frac{1}{\theta_0} - 1,$$

we obtain $$\theta_0 \dot{\Delta}(\theta) = 2\psi_1\left(\frac{2\theta+1}{\theta_0}\right) - \psi_1\left(\frac{\theta+1}{\theta_0}\right)$$

$$= \sum_{k=1}^{\infty} \frac{a_k^2(0) - 2\left(\frac{\theta}{\theta_0}\right)^2}{a_k^2(\theta)a_k^2(2\theta)}.$$

Hence $$2\Delta^2(\theta) + \theta_0 \dot{\Delta}(\theta) = \sum_{k=1}^{\infty} \frac{a_k^2(0)}{a_k^2(\theta) \cdot a_k^2(2\theta)} + 2\sum_{k \neq l}\sum \frac{\theta^2}{\theta_0^2 a_k(\theta)a_k(2\theta)a_l(\theta)a_l(2\theta)}$$

Since for any $k \geq 1$, $a_k(\theta) > 0$ for all $\theta \in \Theta$ and $\Omega(\theta) > 0$ for all $\theta \in \Theta$, we conclude from (10) that $\ddot{Z}(\theta) > 0$ for all $\theta \in \Theta$, that is, $Z(\theta)$ is a strictly convex function of $\theta$. The strict convexity of $Z(\theta)$ implies that $Z(\theta) = 0$ has at most two distinct roots in $\Theta$. We now claim that the question $Z(\theta) = 0$ has a unique root at $\theta = \theta_0$. Indeed, there are a number of ways to prove this claim. One approach is to assume that there is another root $\tilde{\theta}_0 \in \Theta$ such that $\tilde{\theta}_0 \neq \theta_0$. If $\tilde{\theta}_0 > \theta_0$, then $$0 = Z(\tilde{\theta}_0) - Z(\theta_0) = (\tilde{\theta}_0 - \theta_0)\dot{Z}(\theta_0) + \frac{1}{2}(\tilde{\theta}_0 - \theta_0)^2 \ddot{Z}(\theta_0^*)$$

for some $\theta_0^*$ between $\theta_0$ and $\tilde{\theta}_0$. It follows from direct computations that $\Delta(\theta_0) = \theta_0/(\theta_0+1)$ and $\Omega(\theta_0) = \theta_0+1$. Thus, by (9), we have $\dot{Z}(\theta_0) = 1$. This together with the fact that $\ddot{Z}(\theta_0^*) > 0$ leads to a contradiction. If $0 < \tilde{\theta}_0 < \theta_0$, since Z is continuous on $[\tilde{\theta}_0, \theta_0]$ and is differentiable at each point of $(\tilde{\theta}_0, \theta_0)$, the mean value theorem implies that there exists a real number $d \in (\tilde{\theta}_0, \theta_0)$ such that $$\dot{Z}(d) = \frac{Z(\theta_0) - Z(\tilde{\theta}_0)}{\theta_0 - \tilde{\theta}_0} = 0.$$

By the same reasoning, we note that Z is differentiable at each point of $(0, \tilde{\theta}_0)$ and $$\lim_{\theta \to 0^+} Z(\theta) = 0,$$

there exists a real number $c \in (0, \tilde{\theta}_0)$ such that $\dot{Z}(c) = 0$. Thus, we obtain that $c < d$, but $\dot{Z}(c) = \dot{Z}(d) = 0$. This is a contradiction to the observation that $\dot{Z}$ is a strictly increasing function of $\theta$ in view of the fact that $\ddot{Z}(\theta) > 0$ for all $\theta \in \Theta$.

ii. Global Convergence of Newton-Raphson Algorithm for Shape Equation

Theorem 1 provides the theoretical guarantee that the unique global root of the equation $Z(\theta) = 0$ is equal to the true parameter value $\theta_0$. A natural question would be how to find the root of the equation $Z(\theta) = 0$. There are many root-finding procedures that can be used for this purpose. Here we focus on the illustrative Newton-Raphson method due to its quadratic convergence property. Similar theorems can be proved for other root-finding procedures such as secant method. The Newton-Raphson algorithm for finding the unique global root of the equation $Z(\theta) = 0$ is given as follows:

$$\theta_{k+1} = \theta_k - \frac{Z(\theta_k)}{\dot{Z}(\theta_k)} \qquad (11)$$

for $k = 1, 2, \ldots$, where $\theta_1$ is the starting value for the iteration. Our next theorem says that from any starting value $\theta_1$ in a semi-infinite interval $\Theta_{min}$, the Newton-Raphson algorithm (11) converges. This global convergence is in contrast with the generally poor global convergence properties of Newton-Raphson method.

Theorem 2: The Newton-Raphson functional iteration algorithm (11) converges to the true parameter value $\theta_0$ from any starting point $\theta_l \in \Theta_{min}$, where the semi-infinite interval $\Theta_{min}$ is defined as $\Theta_{min} = (\theta_{min}, \infty)$ and $$\theta_{min} = \operatorname*{argmin}_{\theta \in \Theta} Z(\theta).$$

In other words, $\theta_k \to \theta_0$ as $k \to \infty$.

Proof. First we establish the existence and uniqueness of the minimizer $$\theta_{min} = \operatorname*{argmin}_{\theta \in \Theta} Z(\theta)$$

so that argmin notation is well defined. It follows from the strict convexity of Z that the minimization problem of minimizing $Z(\theta)$ subject to $\theta \in \Theta$ has at most one solution (if any). From previous computations given in the proof of Theorem 1, we have $\dot{Z}(\theta_0) = 1$.

Evaluating the right hand limit of the gradient function $\dot{Z}(\theta_0)$ as $\theta$ tends to zero, we obtain that $$\lim_{\theta \to 0^+} \dot{Z}(\theta) = -1.$$

Thus by the continuity of $\dot{Z}$ and the intermediate value theorem, there exists a real number $\theta_{min} \in (0, \theta_0)$ such that $\dot{Z}(\theta_{min}) = 0$. Since $\dot{Z}$ is strictly increasing on $\Theta$, we obtain $\dot{Z}(\theta) > 0$ for $\theta > \theta_{min}$ and $\dot{Z}(\theta) < 0$ for $\theta < \theta_{min}$. Thus the convex minimization problem of minimizing $Z(\theta)$ subject to $\theta \in \Theta$ has a unique solution at the minimizer $\theta_{min}$. To show the convergence of the iterates $$\theta_{k+1} = \theta_k - \frac{Z(\theta_k)}{\dot{Z}(\theta_k)}$$

to the true value $\theta_0$ from any starting point $\theta_1 \in \Theta_{min}$, we consider two situations $\theta_1 \in (\theta_{min}, \theta_0)$ and $\theta_1 \in [\theta_0, \infty)$ separately. If $\theta_1 \in (\theta_{min}, \theta_0)$, we demonstrate that only one step Newton-Raphson iteration starting from $\theta_1$ would move the iterate $\theta_2$ into the interval $[\theta_0, \infty)$. To see this, we observe that $Z(\theta_1)<0$ and $\dot{Z}(\theta)>0$. It follows from the strict convexity and differentiability of Z that $$\dot{Z}(\theta_1) < \frac{Z(\theta_0) - Z(\theta_1)}{\theta_0 - \theta_1} = \frac{-Z(\theta_1)}{\theta_0 - \theta_1}$$

This is equivalent to $$\theta_1 - \frac{Z(\theta_1)}{\dot{Z}(\theta_1)} > \theta_0,$$

that is, $\theta_2 > \theta_0$. Thus it is enough for us to prove that the functional iteration $$\theta_{k+1} = \theta_k - \frac{Z(\theta_k)}{\dot{Z}(\theta_k)}$$

converges to $\theta_0$ from any starting point $\theta_1 \in [\theta_0, \infty)$. To this end, let the function g be defined by $$g(\theta) = \theta - \frac{Z(\theta)}{\dot{Z}(\theta)}$$

and the interval $[\theta_0, \infty)$ be denoted by I. We shall demonstrate that the equation $\theta = g(\theta)$ has a unique fixed point $\theta_0$ on the interval I and the functional iterates $\theta_{k+1} = g(\theta_k)$ converge to $\theta_0$ regardless of their starting point $\theta_1 \in I$. It is clear that the function g is continuous on I and that $g(\theta_0) = \theta_0$ in view of the equation $Z(\theta_0) = 0$ so that $\theta_0$ is a fixed point of g. Furthermore, $\theta_0$ is the only fixed point of g on I. If this were not true, we have another fixed point $\theta_0^* \in I$ with $\theta_0^* \neq \theta_0$ and $\theta_0^* = g(\theta_0^*)$, this would be in contradiction with the fact that $$g(\theta_0^*) = \theta_0^* - \frac{Z(\theta_0^*)}{\dot{Z}(\theta_0^*)} < \theta_0^*.$$

What remains to be shown is that the functional iterates converge to $\theta_0$. It follows from direct computations that $$\dot{g}(\theta) = \frac{Z(\theta)\ddot{Z}(\theta)}{(\dot{Z}(\theta))^2}.$$

Since $\ddot{Z}(\theta)>0$ and $Z(\theta) \geq 0$ for all $\theta \in I$, we conclude that $\dot{g}(\theta) \geq 0$ for all $\theta \in I$ (in fact, $\dot{g}(\theta) > 0$ for all $\theta \in I \setminus \{\theta_0\}$). Hence $g(\theta)$ is an increasing function of $\theta$ on I, which implies that $\theta_0 = g(\theta_0) \leq g(\theta) < \infty$ for all $\theta \in I$. That is, the function g maps the interval I into itself. In view of the fact that $\dot{Z}(\theta)>0$ and, again, $Z(\theta) \geq 0$ for all $\theta \in I$, we have $$\theta_{k+1} = g(\theta_k) = \theta_k - \frac{Z(\theta_k)}{\dot{Z}(\theta_k)} \leq \theta_k$$

for $\theta_k \in I$. This fact together with the observation that $\theta_{k+1} = g(\theta_k) \geq g(\theta_0) = \theta_k$ for $\theta_k \in I$ implies that the sequence $\{\theta_k\}_{k=1}^{\infty}$ is a monotonically decreasing sequence bounded below. Hence the limit $\lim_{k \to \infty} \theta_k$ exists in I and this limit is denoted by $\theta_\infty$. Invoking the continuity of the function g in the defining relation $\theta_{k+1} = g(\theta_k)$ shows that $\theta_\infty$ is a fixed point of the function g in I. By the uniqueness of the fixed point of g on I, we conclude that $\theta_\infty = \theta_0$, that is, $\lim_{k \to \infty} \theta_k = \theta_0$, which completes the proof.

Figure 8:
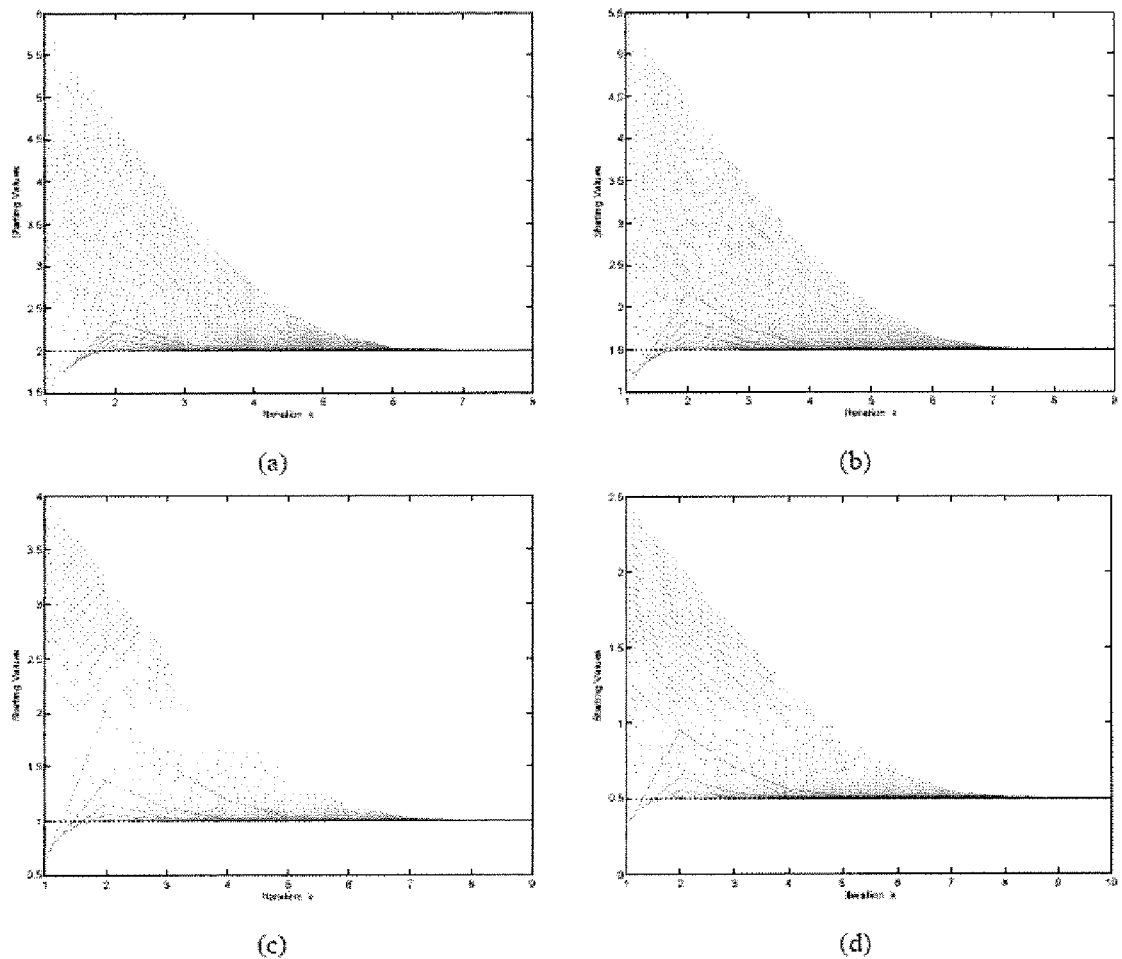
FIGS. 8 and 9 illustrate global convergence of the Newton-Raphson algorithm in accordance with an exemplary embodiment of the present invention.

Some numerical examples are provided in FIG. 8 to demonstrate the global convergence of Newton-Raphson algorithm. From FIG. 8, we see that starting from any point in the semi-infinite interval $\Theta_{min}$, no matter how far away the starting value $\theta_1$ is from the true parameter $\theta_0$, Newton-Raphson iterations always converge to $\theta_0$. More specifically, in FIG. 8, global convergence of the Newton-Raphson algorithm is demonstrated by plots of the trajectory of the functional iterations with different starting values. The solid lines represent the shape estimates $\theta_k$ plotted as functions of the iteration number k. The dotted line denotes the true shape parameter $\theta_0$ corresponding to four different values: (1) $\theta_0=2$, (2) $\theta_0=1.5$, (3) $\theta_0=1$, and (d) $\theta_0=0.5$.

iii. Existence of a Unique Global Root for the Sample-Based Shape Estimating Equation Both Theorem 1 and Theorem 2 are proved with preklowledge of $\theta_0$. In practice they are not operational since $\theta_0$ is unknown. In spite of this, they do provide valuable insights into obtaining analogous results for the sample-based shape estimating equation. With these new insights, we can now prove that with high probability, the sample estimating equation $Z_n(\theta_0) = 0$ has a unique global root on any arbitrarily large interval $\Theta_L = (0, \theta_l)$, where $\theta_L > \theta_0$ is any arbitrarily large real number.

Theorem 3: Let $Z_n$ be defined as in (4). Then there exists a unique global root in $\Theta_L$ that solves the estimating equation $Z_n(\theta) = 0$ with probability tending to 1. Furthermore, let this unique root be denoted by $\hat{\theta}_n$. Then $\hat{\theta}_n \to \theta_0$ in probability, as $n \to \infty$. In other words, $\hat{\theta}_n$ is consistent for estimating $\theta_0$.

Proof: Let $G_n(\theta) = n\bar{Y}_n(2\theta) - n(\theta+1)\bar{Y}_n^2(\theta)$. We note from (7) that $Z_n(\theta)$ has the same roots (if any) as $G_n(\theta)$. Differentiating $G_n(\theta)$ with respect to $\theta$ and using the fact that $$\frac{d\bar{Y}_n(\theta)}{d\theta} = \bar{U}_n(\theta),$$

we obtain $$\dot{G}_n(\theta) = 2n\overline{U}_n(2\theta) - n\overline{Y}_n^2(\theta) - 2n(\theta+1)\overline{Y}_n(\theta)\overline{U}_n(\theta) \quad (12)$$

It follows from the law of large numbers and the continuous mapping theorem every $\theta \in \Theta$, $$\overline{Y}_n(\theta) \xrightarrow{P_0} Y(\theta)$$

$$\overline{U}_n(\theta) \xrightarrow{P_0} U(\theta)$$

Thus by (12), we have $$\frac{1}{n}\dot{G}_n(\theta) \xrightarrow{P_0} \dot{G}(\theta) \quad (13)$$

where $$\dot{G}(\theta) = 2U(2\theta) - Y^2(\theta) - 2(\theta+1)Y(\theta)U(\theta).$$

In particular, (13) implies that $$\frac{1}{n}\dot{G}_n(\theta_0) \xrightarrow{P_0} \dot{G}(\theta_0)$$

It follows from some computations that $$U(\theta) = Y(\theta)\left\{\log\sigma_0 + \frac{1}{\theta_0}\psi_0\left(\frac{\theta+1}{\theta_0}\right)\right\} \quad (14)$$

$$\dot{G}(\theta) = Y^2(\theta)\left\{\frac{2\Omega(\theta)U(2\theta)}{Y(2\theta)} - \frac{2(\theta+1)U(\theta)}{Y(\theta)} - 1\right\}$$

These together with expressions of $Y(\theta)$ and $\Omega(\theta)$ imply that $G(\theta_0) = Y^2(\theta_0) = \sigma_0^{2\theta_0}/\theta_0^2$, which is positive. For any real number $r>0$, define the shrinking neighborhood of $\theta_0$ by $$H_n(\theta_0, r) = \left\{\theta \in \Theta: |\theta - \theta_0| \leq \frac{r}{\sqrt{n\dot{G}(\theta_0)}}\right\} \quad (15)$$

Then $$\sup_{\theta \in H_n(\theta_0,r)}\left|\frac{1}{n}\dot{G}_n(\theta) - \dot{G}(\theta_0)\right| \leq \quad (16)$$

$$\sup_{\theta \in H_n(\theta_0,r)}\left|\frac{1}{n}\dot{G}_n(\theta) - \dot{G}(\theta)\right| + \sup_{\theta \in H_n(\theta_0,r)}\left|\dot{G}(\theta) - \dot{G}(\theta_0)\right|$$

We next show the uniform convergence of $1/n\dot{G}_n(\theta)$ to $G(\theta)$ in probability uniformly for $\theta$ ranging over compacta in $\Theta$. Direct differentiation of $\overline{Y}_n^2(\theta)$ with respect to $\theta$ leads to $$\frac{d^2\overline{Y}_n^2(\theta)}{d\theta^2} = 2\{\overline{U}_n^2(\theta) + \overline{Y}_n(\theta)\overline{V}_n(\theta)\} > 0$$

for all $\theta \in \Theta$ and all n, where we have used the relation that $$\frac{d\overline{U}_n(\theta)}{d\theta} = \overline{V}_n(\theta).$$

Therefore $\overline{Y}_n^2(\theta)$ is a sequence of strictly convex random functions. For every $\theta \in \Theta$, it follows from the law of large numbers and the continuous mapping theorem that $$Y_n^2(\theta) \xrightarrow{P_n} Y^2(\theta).$$

Thus we conclude by the convexity lemma that $$\left|Y_n^2(\theta) - Y^2(\theta)\right| \xrightarrow{P_0} 0$$

for each compact subset K of $\Theta$. By the same reasoning, $$\left|Y_n(\theta) - Y(\theta)\right| \longrightarrow 0$$

in probability.

Define $\overline{W}_n(\theta)$ by $$\overline{W}_n(\theta) = \overline{U}_n(\theta) - \frac{\theta^2}{2n}\sum_{i=1}^{n}\log^3|X_i| \quad (17)$$

Differentiating $\overline{W}_n(\theta)$ twice with respect to $\theta$ yields the following expression:

$$\frac{d^2\overline{W}_n^2(\theta)}{d\theta^2} = \frac{d\overline{V}_n(\theta)}{d\theta} - \frac{1}{n}\sum_{i=1}^{n}\log^3|X_i|$$

Since $$\frac{d^2\overline{V}_n(\theta)}{d\theta^2} > 0$$

for all $\theta \in \Theta$ and all n, it follows that $$\frac{d\overline{V}_n(\theta)}{d\theta} = \frac{1}{n}\sum_{i=1}^{n}|X_i|^\theta\log^3|X_i|$$

is a strictly increasing function of $\theta$. Therefore $$\frac{d\overline{V}_n(\theta)}{d\theta} > \frac{1}{n}\sum_{i=1}^{n}\log^3|X_i|$$

$\log^3|X_i|$ which implies that $$\frac{d^2\overline{W}_n^2(\theta)}{d\theta^2} > 0.$$

We conclude that $\overline{W}_n(\theta)$ is a strictly convex function of $\theta$. By the same argument as before, for every $\theta \in \Theta$, $\overline{W}_n(\theta) \to W(\theta)$ in probability, where $W(\Theta)$ is given as $$W(\theta) = U(\theta) - \frac{\theta^2}{2}E_0\log^3|X| \qquad (18)$$

Hence $$\sup_{\theta \in K}|\overline{W}_n(\theta) - W(\theta)| \xrightarrow{P_0} 0$$

In addition, we note that Y and U are continuous functions on the compact set K and thus are bounded on K. With these facts, we conclude that $$\frac{1}{n}\dot{G}_n(\theta)$$

uniformly converges to $\dot{G}(\theta)$ in probability on any compact subset K of $\Theta$. Therefore, $$\sup_{\theta \in H_n(\theta_0,r)}\left|\frac{1}{n}\dot{G}_n(\theta) - \dot{G}(\theta)\right| \leq \sup_{\theta \in K}\left|\frac{1}{n}\dot{G}_n(\theta) - \dot{G}(\theta)\right| \xrightarrow{P_0} 0 \qquad (19)$$

as $n \to \infty$, where the compact set K can be taken to be, for example, as $$K = \left[\frac{1}{2}\theta_0, 2\theta_0\right].$$

The uniform continuity of $\dot{G}$ on the compact set implies that $$\sup_{\theta \in H_n(\theta_0,r)}|\dot{G}(\theta) - \dot{G}(\theta_0)| \to 0 \qquad (20)$$

as $n \to \infty$. Combining (19) and (20) together with (16), we conclude that $$\sup_{\theta \in H_n(\theta_0,r)}\left|\frac{1}{n}\dot{G}_n(\theta) - \dot{G}(\theta_0)\right| \xrightarrow{P_0} 0 \qquad (21)$$

Next we show that the sequence $$\frac{1}{\sqrt{n}}G_n(\theta_0)$$

is uniformly tight. It follows from extensive computations that $$\frac{1}{\sqrt{n}}G_n(\theta_0) = \qquad (22)$$

$$\sqrt{n}\,[\overline{Y}_n(2\theta_0) - Y(2\theta_0)] - \sqrt{n}\,(\theta_0 + 1)[\overline{Y}_n(\theta_0) - Y(\theta_0)]^2 -$$
$$2\sqrt{n}\,(\theta_0 + 1)Y(\theta_0)[\overline{Y}_n(\theta_0) - Y(\theta_0)] + \sqrt{n}\,[Y(2\theta_0) - (\theta_0 + 1)Y^2(\theta_0)]$$

We observe that $Z(\theta_0)=0$. This implies that $Y(2\theta_0)-(\theta_0+1)Y^2(\theta_0)=0$, so that the last term of (22) is equal to zero. By the central limit theorem, both $\sqrt{n}[\overline{Y}_n(\theta_0)-Y(\theta_0)]$ and $\sqrt{n}[\overline{Y}_n(2\theta_0)-Y(2\theta_0)]$ converge in distribution to the normal distributions with mean zero and finite variances $\text{Var}_0|X|^{\theta_0}$ and $\text{Var}_0|X|^{2\theta_0}$, respectively. Thus, both the first and the third terms of (22) $O_p(1)$. By the same reasoning, $$\sqrt{n}\,[\overline{Y}_n(\theta_0) - Y(\theta_0)]^2 = \frac{1}{\sqrt{n}}\left[\sqrt{n}\,(\overline{Y}_n(\theta_0) - Y(\theta_0))\right]^2$$
$$= o(1)O_p(1)$$
$$= o_p(1)$$

This finishes the proof that $$\frac{1}{\sqrt{n}}G_n(\theta_0) = O_p(1).$$

Thus for each $\epsilon>0$, there exist a positive real number M and an integer $N_1$ such that $P_0(E_n)>1-\epsilon/2$ for all $n>N_1$, where $$E_n = \left\{\left|\frac{1}{\sqrt{n\dot{G}(\theta_0)}}G_n(\theta_0)\right| \leq M\right\}$$

For any given $\delta>0$, choose the positive real number r large enough such that $$r^2 - Mr - \delta > 0 \qquad (23)$$

Consider the two end points of the shrinking neighborhood $H_n(\theta_0, r)$ as defined in (15):

$$\theta = \theta_0 \pm \frac{r}{\sqrt{n\dot{G}(\theta_0)}}.$$

It follows from the Taylor theorem that $$G_n(\theta) = G_n(\theta_0) + (\theta - \theta_0)\dot{G}_n(\theta_n^*)$$

where $\theta_n^*$ is between $\theta$ and $\theta_0$. Thus $$(\theta - \theta_0)G_n(\theta) = \qquad (24)$$
$$r \cdot \text{sign}(\theta - \theta_0)\frac{1}{\sqrt{n\dot{G}(\theta_0)}}G_n(\theta_0) + r^2 + R_n(\theta_0)$$

where $$R_n(\theta_0) = \frac{r^2}{\dot{G}(\theta_0)}\left[\frac{1}{n}\dot{G}_n(\theta_n^*) - \dot{G}(\theta_0)\right]$$

It follows from (21) that $$R_n(\theta_0) \xrightarrow{P_0} 0.$$

Thus for the given $\epsilon$ and $\delta$, we can find a positive integer $N_2$ such that for all $n > N_2$, we have $P_0(F_n) > 1 - \epsilon/2$, where $F_n = \{|R_n(\theta_0)| \leq \delta\}$. Therefore, for all $n > N = \max\{N_1, N_2\}$, we obtain $P_0(E_n \cap F_n) > 1 - \epsilon$. On the event $E_n \cap F$, we have $$r \cdot \text{sign}(\theta - \theta_0)\frac{1}{\sqrt{n\dot{G}(\theta_0)}}G_n(\theta_0) \geq -Mr$$

and $R_n(\theta_0) \geq -\delta$. Thus, by (23) and (24), we have $$(\theta - \theta_0)G_n(\theta) \geq r^2 - Mr - \delta > 0$$

We conclude that $$G_n\left(\theta_0 + \frac{r}{\sqrt{n\dot{G}(\theta_0)}}\right) > 0 \text{ and } G_n\left(\theta_0 - \frac{r}{\sqrt{n\dot{G}(\theta_0)}}\right) < 0.$$

Since $G_n$ is a continuous function of $\theta$, there exist at least one solution $\hat{\theta}_n \in H_n(\theta_0, r)$ such that $G_n(\hat{\theta}_n) = 0$. Thus for all $n > N$, $P_0(\hat{\theta}_n \in H_n(\theta_0, r)) \geq P_0(E_n \cap F_n) > 1 - \epsilon$. This implies that $P_0(G_n(\hat{\theta}_n) = 0) \to 1$ as $n \to \infty$ and $$\hat{\theta}_n \xrightarrow{P_0} \theta_0,$$

as $n \to \infty$.

What remains to be shown is the uniqueness of the root $\hat{\theta}_n$. We shall show that on the large interval $\Theta_L$, with probability tending to 1, the solution of the estimating equation $Z_n(\theta) = 0$ is unique for all sufficiently large n. To this end, we extend the values of continuous functions $Z_n, \dot{Z}_n, \ddot{Z}_n$ at $\theta = 0$ by defining them to be the corresponding right-hand limits, $$Z_n(0) = \lim_{\theta \to 0^+} Z_n(\theta) = 0$$
$$\dot{Z}_n(0) = \lim_{\theta \to 0^+} \dot{Z}_n(\theta) = -1$$

-continued and $$\ddot{Z}_n(0) = \lim_{\theta \to 0^+} \ddot{Z}_n(\theta)$$
$$= \frac{2}{n}\sum_{i=1}^{n}\left(\log|X_i| - \frac{1}{n}\sum_{i=1}^{n}\log|X_i|\right)^2$$

It follows from the same arguments as given in the proof of Lemma 1 that $$\sup_{\theta \in K}|\ddot{Z}_n(\theta) - \ddot{Z}(\theta)| \xrightarrow{P_0} 0,$$

where $K = [0, \theta_L]$. Hence, for each $\epsilon > 0$ and $\delta > 0$, there exists a positive integer N such that for all $n > N$, $P(|\ddot{Z}_n(\theta) - \ddot{Z}(\theta)| \leq \delta$ for all $\theta \in K) > 1 - \epsilon$. On the compact set K, $\ddot{Z}(\theta)$ is uniformly continuous and achieves both its minimum and maximum values. Since $\ddot{Z}(\theta) > 0$ for all $\theta \in \Theta$ and by direct calculation $\ddot{Z}(0) > 0$, there exists a real number $\theta_- \in K$ such that $$\inf_{\theta \in K}\ddot{Z}(\theta) = \ddot{Z}(\theta_-) > 0.$$

Therefore for $0 < \delta < \ddot{Z}(\theta_-)$ and for all $n > N$, we have $P(\ddot{Z}_n(\theta) > 0$ for all $\theta \in K) > 1 - \epsilon$. This implies that $P(C_n) > 1 - \epsilon$ for all $n > N$, where $C_n = \{Z_n$ is a strictly convex function of $\theta \in K\}$. On the event $C_n$, it will be shown that the solution of the equation $Z_n(\theta) = 0$ for $\theta \in \Theta_L$ is unique for all $n > N$. For any $\omega \in C_n$ and suppose that $\tilde{\theta}_n$ is another solution of the equation $Z_n(\theta) = 0$ such that $\tilde{\theta}_n(\omega) \neq \hat{\theta}_n(\omega)$ for some $n > N$. Then $0 < \tilde{\theta}_n(\omega) \wedge \hat{\theta}_n(\omega) < \tilde{\theta}_n(\omega) \vee \hat{\theta}_n(\omega) < \theta_L$, where the notation $\wedge$ and $\vee$ denote minima and maxima, respectively. Thus there exists a $0 < \lambda_n(\omega) < 1$ such that $$\tilde{\theta}_n(\omega) \wedge \hat{\theta}_n(\omega) = \lambda_n(\omega)(\tilde{\theta}_n(\omega) \vee \hat{\theta}_n(\omega))$$

It follows from the strict convexity of $Z_n$ on K that $$Z_n(\tilde{\theta}_n(\omega) \wedge \hat{\theta}_n(\omega)) < \lambda_n(\omega) Z_n(\tilde{\theta}_n(\omega) \vee \hat{\theta}_n(\omega)) \qquad (25)$$

In view of the equations $Z_n(\tilde{\theta}_n(\omega)) = 0$ and $Z_n(\hat{\theta}_n(\omega)) = 0$, we have $$Z_n(\tilde{\theta}_n(\omega) \wedge \hat{\theta}_n(\omega)) = Z_n(\tilde{\theta}_n(\omega) \vee \hat{\theta}_n(\omega)) = 0$$

This fact contradicts with the equation (25). We conclude that, with probability tending to 1, the solution of the equation $Z_n(\theta) = 0$ is unique on the sufficiently large interval $\Theta_L$ for all large n. The proof is now complete.

In practical applications, both the scale and shape parameters are usually estimated. Given the consistent estimator $\hat{\theta}_n$ provided by Theorem 3, it would be natural to plug the estimator $\hat{\theta}_n$ of $\theta_0$ into the formula for $\hat{\sigma}_0$ given in Section A. Let the resulting scale estimator be denoted by $$\hat{\sigma}_n := \left(\frac{\hat{\theta}_n}{n}\sum_{i=1}^{n}|X_i|^{\hat{\theta}_n}\right)^{\frac{1}{\hat{\theta}_n}} \qquad (26)$$

Then the following corollary is a direct consequence of Theorem 3.

Corollary 1: The scale estimator $\hat{\sigma}_n$ given in equation (26) is a consistent estimator of the scale parameter $\sigma_0$.

Proof. With the notation introduced in Section B, we can rewrite $\hat{\sigma}_0$ and $\sigma_0$ as $\hat{\sigma}_0 = (\hat{\theta}_n \overline{Y}_n(\hat{\theta}_n))^{1/\hat{\theta}_n}$ and $\sigma_0 = (\theta_0 Y(\theta_0))^{1/\theta_0}$, respectively. It follows from Taylor's theorem that $$\overline{Y}_n(\hat{\theta}_n) = \overline{Y}_n(\theta_0) + (\hat{\theta}_n - \theta_0)\overline{U}_n(\theta_0) + \frac{1}{2}(\hat{\theta}_n - \theta_0)^2 \overline{V}_n(\tilde{\theta}_n) \qquad (27)$$

where $\tilde{\theta}_n$ is between $\theta_0$ and $\theta_n$. By Theorem 3, $\hat{\theta}_n$ is a consistent estimator of $\theta_0$, hence $$\hat{\theta}_n \xrightarrow{P_0} \theta_0.$$

This implies that there exists some compact set K containing $\theta_0$ such that for sufficiently large n $$|\overline{V}_n(\tilde{\theta}_n)| \leq \sup_{\theta \in K} |\overline{V}_n(\theta) - V(\theta)| + |V(\tilde{\theta}_n)|.$$

Since $\overline{V}_n$ is a sequence of strictly convex functions of $\theta$ and $$\overline{V}_n(\theta) \xrightarrow{P_0} V(\theta)$$

for every $\theta \in \Theta$ in view of the law of large numbers, we conclude again by the convexity lemma that sup $$\sup_{\theta \in \Theta} |\overline{V}_n(\theta) - V(\theta)| \xrightarrow{P_0} 0.$$

This fact coupled with the continuous mapping theorem shows that $$|\overline{V}_n(\hat{\theta}_n)| \leq o_p(1) + O_p(1) = O_p(1)$$

By the law of large numbers, we have $$\overline{Y}_n(\theta_0) \xrightarrow{P_0} Y(\theta_0)$$

and $$\overline{U}_n(\theta_0) \xrightarrow{P_0} U(\theta_0).$$

From these facts and the equation (27), we conclude that $$\overline{Y}_n(\theta_0) \xrightarrow{P_0} Y(\theta_0).$$

An application of the continuous mapping theorem completes the proof.

iv. Global Convergence of Newton-Raphson Algorithm for the Sample-Based Shape Estimating Equation To find the unique global root $\hat{\theta}_n$ of the equation $Z_n(\theta) = 0$, we consider the Newton-Raphson functional iteration algorithm, $$\hat{\theta}_{n,k+1} = \hat{\theta}_{n,k} - \frac{Z_n(\hat{\theta}_{n,k})}{\dot{Z}_n(\hat{\theta}_{n,k})} \qquad (28)$$

for $k = 1, 2, \ldots$, where $\hat{\theta}_{n,1}$ is the starting value for the iteration.

Theorem 4: With probability tending to one, the Newton-Raphson functional iteration $\{\hat{\theta}_{n,k}\}_{k=1}^{\infty}$ defined by the algorithm (28) converges to the unique global root $\hat{\theta}_n$ from any starting point $\hat{\theta}_{n,1} \in \Theta_{min}$. In other words, $$P_0\left(\lim_{k \to \infty} \hat{\theta}_{n,k} = \hat{\theta}_n\right) \to 1 \text{ as } n \to \infty.$$

Proof. It follows from Lemma 1 that $\ddot{Z}_n(\theta)$ converges to $\ddot{Z}_n(\theta)$ in probability uniformly for all $\theta$ in any compact set $K \subset \Theta$. For any real number $\epsilon > 0$, let $A_n$ be the event that $|\ddot{Z}_n(\theta) - \ddot{Z}(\theta)| < \epsilon$ for all $\theta \in K$. Then for any real number $\delta > 0$, there exists a positive integer $N_1$ such that for all $n > N_1$, we have $P_0(A_n) > 1 - \delta$. Since $\ddot{Z}$ is a continuous function of $\theta$ and $\ddot{Z}(\theta) > 0$ for all $\theta \in \Theta$, there exists a real number $\theta_\_ \in K$ such that $$\ddot{Z}(\theta) \geq \inf_{\theta \in K} \ddot{Z}(\theta) = \ddot{Z}(\theta_\_) > 0 \text{ for all } \theta \in K.$$

Hence for any $0 < \epsilon < \ddot{Z}(\theta_\_)$, the event $A_n$ implies the event $B_n = \{\ddot{Z}_n(\theta) > 0$ for all $\theta \in K\}$. Let $C_n$ be the event that $Z_n$ is a strictly convex function of $\theta$ and $\dot{Z}_n$ is a strictly increasing function of $\theta$ on K. Then the event $B_n$ implies the event $C_n$ so that $P_0(C_n) \geq P_0(B_n) > 1 - \delta$ for all $n > N_1$. By Theorem $$\hat{\theta}_n \xrightarrow{P_0} \theta_0,$$

hence there exists a positive integer $N_2$ such that for all $n > N_2$, $P_0(D_n) > 1 - \delta$, where the event $D_n = \{|\hat{\theta}_n - \theta_0| < \epsilon\}$. For any real number L such that $\theta_{min} < L < \theta_0$ and for $0 < \epsilon < \theta_0 - L$. The event $D_n$ implies the event $E_n = \{L < \hat{\theta}_n < 2\theta_0 - L\}$. Thus for all $n > \max\{N_1, N_2\}$ and $0 < \epsilon < \min\{\theta_0 - L, \ddot{Z}(\theta_\_)\}$, we obtain $P_0(C_n \cap E_n) \geq 1 - 2\delta$. To show the convergence of the Newton-Raphson algorithm from any starting point $\hat{\theta}_{n,1} \in \Theta_{min}$, we will establish first that for any given starting value $\hat{\theta}_{n,1} = \hat{\theta}_1$, if $\theta_1 \in (\theta_{min}, \hat{\theta}_n)$, then only one step Newton-Raphson iteration would, with probability tending to one, move the iterate $\hat{\theta}_{n,2}$ into the interval $[\hat{\theta}_n, \infty)$. Let M be any arbitrary large real number greater than max $$\left\{2\theta_0, \theta_1 + 2\frac{|Z(\theta_1)|}{\dot{Z}(\theta_1)}\right\}$$

and choose the real number L such that $\theta_{min} < L < \min(\theta_0, \theta_1)$, and take the compact subset K as $K = [L, M]$. It follows again from Lemma 1 that $\dot{Z}_n(\theta)$ converges uniformly to $\dot{Z}(\theta)$ in probability on the compact set K. Hence there exists a positive integer $N_3$ such that for all $n>N_3$, we have $P_0(|\dot{Z}_n(\theta)-\dot{Z}(\theta)|<\epsilon$ for all $\theta \in K)>1-\delta$. Since $\dot{Z}$ is a strictly increasing function of $\theta$, we conclude that $\dot{Z}(L)>0=\dot{Z}(\theta_{min})$. Thus, for all $0<\epsilon<\dot{Z}(L)$ and all $n>N_3$, we have $P_0(F_n)>1-\delta$, where the event $F_n=\{\dot{Z}_n(\theta)>0$ for all $\theta \in K\}$. Let the event $G_n$ be defined as $G_n=\{Z_n(\hat{\theta}_n)=0\}$. Theorem 3 implies that there exists a positive integer $N_4$ such that for all $n>N_4$, we have $P_0(G_n)>1-\delta$. Combining this fact with previous results for the events $C_n$, $E_n$, and $F_n$, we conclude that $P_0(C_n \cap E_n \cap F_n \cap G_n)>1-4\delta$ for all $$n > \max_{1 \leq i \leq 4}\{N_i\}$$

and $0<\epsilon<\min\{\theta_0-L, \ddot{Z}(\theta_-), \dot{Z}(L)\}$. On the event $C_n \cap E_n \cap F_n \cap G_n$, it follows from the strict convexity of $Z_n$ and the monotonicity of $\dot{Z}_n$ that $$\dot{Z}_n(\hat{\theta}_{n,1}) < \frac{Z_n(\hat{\theta}_n) - Z_n(\hat{\theta}_{n,1})}{\hat{\theta}_n - \hat{\theta}_{n,1}} = \frac{-Z_n(\hat{\theta}_{n,1})}{\hat{\theta}_n - \hat{\theta}_{n,1}}$$

and $\dot{Z}_n(\hat{\theta}_{n,1})>0$. These are equivalent to $$\hat{\theta}_{n,1} - \frac{Z_n(\hat{\theta}_{n,1})}{\dot{Z}_n(\hat{\theta}_{n,1})} > \hat{\theta}_n,$$

that is, $\hat{\theta}_{n,2}>\hat{\theta}_n$. It follows from the uniform convergence of $Z_n$ and $\dot{Z}_n$ on K to Z and $\dot{Z}$ in probability, respectively and the uniform continuity of Z and $\dot{Z}$ on the compact subset K that there exists a positive integer $N_5$ such that for all $n>N_5$, $$P_0\left(\sup_{\theta \in K}\left|\frac{Z_n(\theta)}{\dot{Z}_n(\theta)} - \frac{Z(\theta)}{\dot{Z}(\theta)}\right| < \epsilon\right) > 1-\delta$$

Consequently, $P_0(H_n)>1-\delta$ where $$H_n = \left\{-\frac{Z(\theta_1)}{\dot{Z}(\theta_1)} - \epsilon < \frac{Z_n(\theta_1)}{\dot{Z}_n(\theta_1)} < \frac{|Z(\theta_1)|}{\dot{Z}(\theta_1)} + \epsilon\right\}$$

Thus for all $$n > \max_{1 \leq i \leq 5}\{N_i\} \text{ and } 0 < \epsilon < \min\left\{\theta_0 - L, \ddot{Z}(\theta_-), \dot{Z}(L), \frac{|Z(\theta_1)|}{\dot{Z}(\theta_1)}\right\},$$

we have $P_0(C_n \cap E_n \cap F_n \cap G_n \cap H_n)>1-5\delta$, which implies that $P_0(\hat{\theta}_n \leq \hat{\theta}_{n,2}<M)>1-5\delta$.

Therefore it is enough for us to show that, with probability tending to one, the Newton-Raphson iteration $\{\hat{\theta}_{n,k}\}_{k=1}^{\infty}$ converges to $\hat{\theta}_n$ as $k \to \infty$ from any starting point $\hat{\theta}_{n,1} \in [\hat{\theta}_n, \infty)$. In the following, we will use the same notations and definitions of events as given above. Let the function $g_n$ be defined by $$g_n(\theta) = \theta - \frac{Z_n(\theta)}{\dot{Z}_n(\theta)} \text{ for } \theta \in I_n,$$

where $I_n$ denotes the interval $[\hat{\theta}_n, M)$. We consider the equation $\theta = g_n(\theta)$ on the interval $I_n$ and it is clear that $g_n$ is a continuous function of $\theta$. We observe that for sufficiently large n and for $0<\epsilon<\min\{\theta_0-L, \ddot{Z}(\theta_-), \dot{Z}(L)\}$, on the event $B_n \cap E_n F_n \cap G_n$, we have $g_n(\hat{\theta}_n)=\hat{\theta}_n$ in view of the equation $Z_n(\hat{\theta}_n)=0$ so that $\hat{\theta}_n$ is a fixed point of $g_n$. Since $\hat{\theta}_n$ is the unique root of $Z_n$ by Theorem 3, we conclude that $\hat{\theta}_n$ is the only fixed point of $g_n$ on $I_n$. To show that the functional iterations converge, we compute the derivative of $g_n(\theta)$ with respect to $\theta$ and obtain $$\dot{g}_n(\theta) = \frac{Z_n(\theta)\ddot{Z}_n(\theta)}{[\dot{Z}_n(\theta)]^2}$$

For simplicity of presentation, all the following arguments are made on the event $B_n \cap E_n \cap F_n \cap G_n$ for sufficiently large n and for $0<\epsilon<\min\{\theta_0-L,\ddot{Z}(\theta_-),\dot{Z}(L)\}$ unless otherwise specified. Since $\ddot{Z}_n(\theta)>0$ and $Z_n(\theta) \geq 0$ for all $\theta \in I_n$, we conclude that $\dot{g}_n(\theta) \geq 0$ for all $\theta \in I_n$ (in fact, $\dot{g}_n(\theta)>0$ for all $\theta \in I_n\setminus\{\hat{\theta}_n\}$). Thus $g_n$ is an increasing function of $\theta$, which implies that $\hat{\theta}_n=g_n(\hat{\theta}_n) \leq g_n(\theta)<M$ for all $\theta \in I_n$. That is, the function $g_n$ maps the interval $I_n$ into itself. It follows from $\dot{Z}_n(\theta)>0$ and $Z_n(\theta) \geq 0$ for all $\theta \in I_n$ that $$\hat{\theta}_{n,k+1} = g_n(\hat{\theta}_{n,k}) = \hat{\theta}_{n,k} - \frac{Z_n(\hat{\theta}_{n,k})}{\dot{Z}_n(\hat{\theta}_{n,k})} \leq \hat{\theta}_{n,k}$$

for $\hat{\theta}_{n,k} \in I_n$. This fact coupled with the observation that $\hat{\theta}_{n,k+1}=g_n(\hat{\theta}_{n,k}) \geq g_n(\hat{\theta}_n)=\hat{\theta}_n$ for $\hat{\theta}_{n,k} \in I_n$ implies that the sequence $\{\hat{\theta}_{n,k}\}_{k=1}^{\infty}$ is a monotonically decreasing sequence bounded below. Hence, the limit $$\lim_{k \to \infty} \hat{\theta}_{n,k}$$

exists in $I_n$ and this limit is denoted by $\hat{\theta}_{n,\infty}$. Invoking the continuity of $g_n$ shows that $\hat{\theta}_{n,\infty}=g_n(\hat{\theta}_{n,\infty})$. That is, $\hat{\theta}_{n,\infty}$ is a fixed point of $g_n$ in $I_n$. By the uniqueness of the fixed point of $g_n$ on $I_n$, we conclude that $\hat{\theta}_{n,\infty}=\hat{\theta}_n$. Since for $$n > \max_{1 \leq i \leq 4}\{N_i\}, P_0(B_n \cap E_n \cap F_n \cap G_n) > 1-4\delta.$$

We conclude that $$P_0\left(\lim_{k \to \infty} \hat{\theta}_{n,k} = \hat{\theta}_n\right) > 1-4\delta.$$

Figure 9:
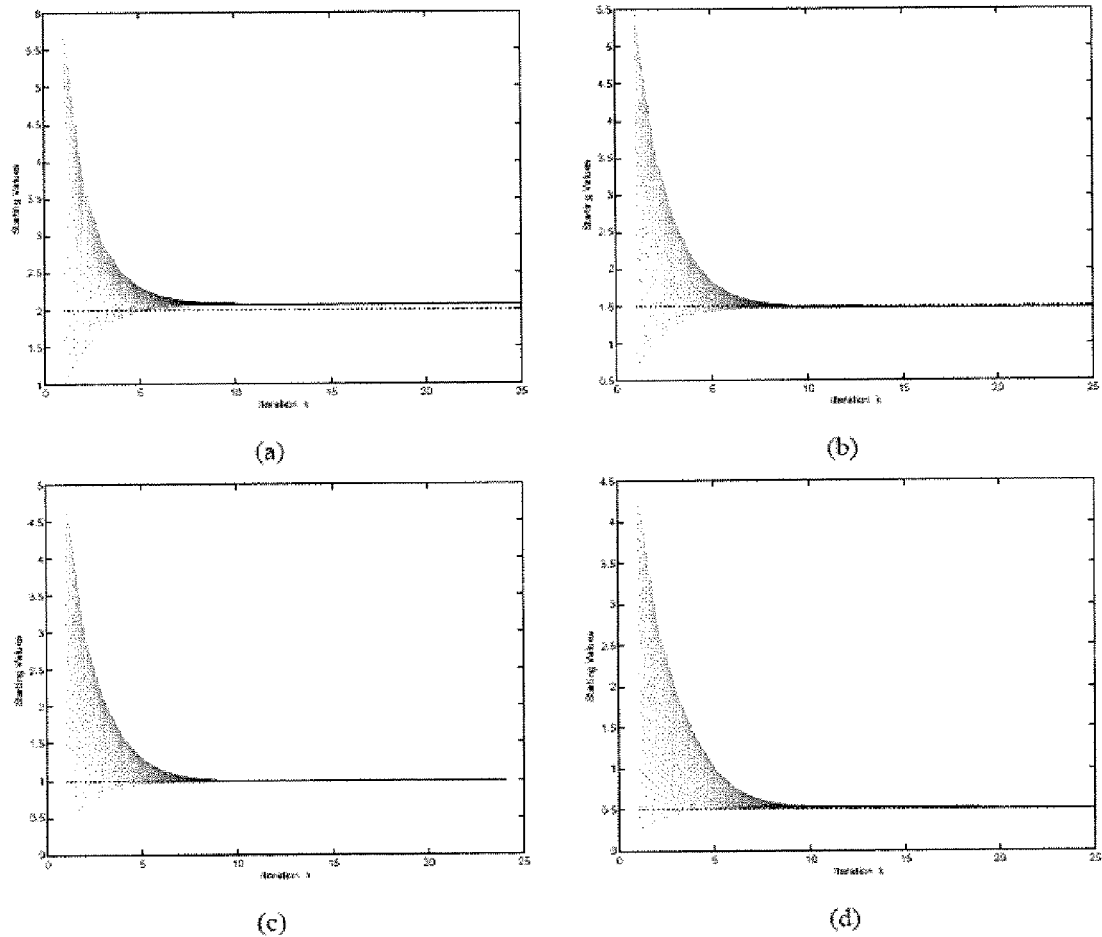

Some numerical examples are provided in FIG. 9 to demonstrate the global convergence of Newton-Raphson algorithm for the sample-based shape estimating equation. From FIG. 9, we see that starting from any point in the semi-infinite interval $\Theta_{min}$, no matter how far away the starting value $\theta_1$ is from the true parameter $\theta_0$, with probability tending to 1, Newton-Raphson iterations $\hat{\theta}_{n,k}$ converge to $\hat{\theta}_n$ as k→∞. More specifically, in FIG. 9, global convergence of the Newton-Raphson algorithm is demonstrated by plots of the trajectory of the functional iterations with different starting values. The solid lines represent the shape estimates $\hat{\theta}_{n,k}$ plotted as functions of the iteration number k. The dotted line denotes the true parameter $\theta_n$. The sample shape function $Z_n$ and its derivative $\dot{Z}_n$ are based on a single random sample of size n=500 generated from the GGD with scale parameter $\sigma_0=1$ and with the true shape parameter $\theta_0$ corresponding to four different values: (a) $\theta_0=2$, (b) $\theta_0=1.5$, (c) $\theta_0=1$, and (d) $\theta_0=0.5$.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A computer-implemented method for performing digital signal processing, comprising:
    obtaining a first set of digitized coefficients from source data;
    determining a best-fit distribution of a generalized Gaussian distribution for the set of digitized coefficients, wherein determining the best-fit distribution includes determining parameters for the generalized Gaussian distribution, wherein determining the parameters includes determining an actual shape parameter of the generalized Gaussian distribution by: (i) applying a first algorithm to the digitized coefficients, wherein the first algorithm depends upon a ratio of a first summation of the digitized coefficients to a second summation of the digitized coefficients and wherein the first and second summations depend, at least in part, upon a variable shape parameter, and (ii) determining, via one or more iterations, a root value for the variable shape parameter of the first algorithm, wherein the iterations are globally-convergent to the root value irrespective of a starting value of the variable shape parameter and wherein the actual shape parameter comprises the root value;
    wherein the first algorithm comprises $$\frac{\frac{1}{n}\sum_{i=1}^{n}|X_i|^{2\theta}}{\left(\frac{1}{n}\sum_{i=1}^{n}|X_i|^{\theta}\right)^2}-(\theta+1),$$

where n in the first algorithm is associated with the number of digitized coefficient $X_i$ in the first algorithm is associated with a value of each of the digitized coefficients, and $\theta$ is associated with the variable shape parameter;
    applying a quantization algorithm to the first set of digitized coefficients to obtain a second set of quantizers, wherein the quantization algorithm is based at least in part on the determined best-fit distribution; and
    providing the second set of quantizers as a compressed representation of the source data,
    wherein the prior steps are performed by one or more computers.

2. The computer-implemented method of claim 1, wherein the iterations comprise one of Newton-Raphson iterations or Halley's method iterations.

3. The computer-implemented method of claim 1, wherein determining parameters further includes determining a scale parameter of the generalized Gaussian distribution from the value of the actual shape parameter.

4. The computer-implemented method of claim 1, wherein the source data includes an analog signal and obtaining the first set of digitized coefficients comprises applying a transform to the analog signal to generate the first set of digitized coefficients.

5. The computer-implemented method of claim 4, wherein the transform comprises a time-frequency transform, wherein the time-frequency transform includes one of a Fast Fourier Transform, a Wavelet Transform, or a Discrete Cosine Transform.

6. The computer-implemented method of claim 1, wherein the quantization algorithm comprises a Lloyd-Max algorithm.

7. A system for performing digital signal processing, comprising:
    a memory for storing executable instructions;
    a processor in communication with the memory, wherein the process is operable to execute the stored instructions to:
        obtain a first set of digitized coefficients from source data;
        determine a best-fit distribution of a generalized Gaussian distribution for the set of digitized coefficients, wherein the best-fit distribution is determined at least in part by determining an actual shape parameter of the generalized Gaussian distribution by: (i) applying a first algorithm to the digitized coefficients, wherein the first algorithm depends upon a ratio of a first summation of the digitized coefficients to a second summation of the digitized coefficients and wherein the first and second summations depend, at least in part, upon a variable shape parameter, and (ii) determining, via one or more iterations, a root value for the variable shape parameter of the first algorithm, wherein the iterations are globally-convergent to the root value irrespective of a starting value of the variable shape parameter and wherein the actual shape parameter comprises the root value;
        wherein the first algorithm comprises $$\frac{\frac{1}{n}\sum_{i=1}^{n}|X_i|^{2\theta}}{\left(\frac{1}{n}\sum_{i=1}^{n}|X_i|^{\theta}\right)^2}-(\theta+1),$$

where n in the first algorithm is associated with the number of digitized coefficient, $X_i$ in the first algorithm is associated with a value of each of the digitized coefficients, and $\theta$ is associated with the variable shape parameter;
        apply a quantization algorithm to the first set of digitized coefficients to obtain a second set of quantizers, wherein the quantization algorithm is based at least in part on the determined best-fit distribution; and
        provide the second set of quantizers as a compressed representation of the source data.

8. The system of claim 7, wherein the iterations comprise one of Newton-Raphson iterations or Halley's method iterations.

9. The system of claim 7, wherein the quantization algorithm comprises a Lloyd-Max algorithm.

10. The system of claim 7, wherein the source data includes an analog signal and obtaining the first set of digitized coefficients comprises applying a transform to the analog signal to generate the first set of digitized coefficients.

11. A computer-implemented method for performing digital signal processing, comprising:
  retrieving suspected encoded data;
  determining at least one parameter of a generalized Gaussian distribution for the suspected encoded data, wherein determining at least one parameter includes determining an actual shape parameter of the generalized Gaussian distribution by: (i) applying a first algorithm to digitized coefficients of the suspected encoded data, wherein the first algorithm depends upon a ratio of a first summation of the digitized coefficients to a second summation of the digitized coefficients and wherein the first and second summations depend, at least in part, upon a variable shape parameter, and (ii) determining, via one or more iterations, a root value for the variable shape parameter of the first algorithm, wherein the iterations are globally-convergent to the root value irrespective of a starting value of the variable shape parameter and wherein the actual shape parameter comprises the root value;
  wherein the first algorithm comprises $$\frac{\frac{1}{n}\sum_{i=1}^{n}|X_i|^{2\theta}}{\left(\frac{1}{n}\sum_{i=1}^{n}|X_i|^{\theta}\right)^2}-(\theta+1),$$

where n in the first algorithm is associated with the number of digitized coefficient $X_i$ in the first algorithm is associated with a value of each of the digitized coefficients, and $\theta$ is associated with the variable shape parameter;
  determining a digital watermark within the suspected encoded data based at least in part on at least one the determined parameter; and
  extracting the digital watermark from the suspected encoded data,
  wherein the prior steps are performed by one or more computers.

12. The computer-implemented method of claim 11, wherein the iterations comprise one of Newton-Raphson iterations or Halley's method iterations.

13. The computer-implemented method of claim 11, wherein the digital watermark includes a plurality of bits associated with an origin of the encoded data.

* * * * *